(12) United States Patent
Nishida et al.

(10) Patent No.: US 6,600,195 B1
(45) Date of Patent: Jul. 29, 2003

(54) SEMICONDUCTOR DEVICE

(75) Inventors: Yukio Nishida, Hyogo (JP); Hirokazu Sayama, Hyogo (JP); Hidekazu Oda, Hyogo (JP); Toshiyuki Oishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/637,870

(22) Filed: Aug. 15, 2000

(30) Foreign Application Priority Data

Mar. 21, 2000 (JP) ......................... 2000-078358

(51) Int. Cl.[7] .................. H01L 29/76; H01L 29/94; H01L 31/052; H01L 31/113; H01L 31/119
(52) U.S. Cl. .................. 257/335; 257/336; 257/338; 257/341; 257/343; 257/344
(58) Field of Search .................. 257/335, 341, 257/336, 343, 338, 344

(56) References Cited

FOREIGN PATENT DOCUMENTS

| JP | 4-155838 | 5/1992 |
| JP | 8-97423 | 4/1996 |

*Primary Examiner*—Wael Fahmy
*Assistant Examiner*—Shrinivas H Rao
(74) *Attorney, Agent, or Firm*—McDermott, Will & Emery

(57) ABSTRACT

A semiconductor device capable of preventing variations in threshold voltage and having high reliability is provided. The semiconductor device includes a semiconductor substrate having a semiconductor region, and a field-effect transistor. The field-effect transistor includes a gate electrode, source and drain regions, and a channel region. The channel region includes a pair of lightly doped impurity regions having a relatively low impurity concentration as well as a heavily doped impurity region located between the lightly doped impurity regions and having a relatively high impurity concentration.

8 Claims, 16 Drawing Sheets

SEMICONDUCTOR DEVICE

BACKGROUND OF THE INVENTION

1. Field of the Invention

The invention relates to a semiconductor device and a method of manufacturing the same, and in particular relates to a semiconductor device having a field-effect transistor and a method of manufacturing the same.

2. Description of the Background Art

In recent years, demands for semiconductor devices have been rapidly increased owing to remarkable spread of information devices such as computers. In connection with functions, semiconductor devices having large storage capacities and capable of fast operation have been demanded. Accordingly, technical development has been made for improving the density or degree of integration, response and reliability of the semiconductor device.

Among the semiconductor devices, field-effect transistors have been used as components forming a dynamic random access memory and a static random access memory. The field-effect transistor has a gate electrode formed on a semiconductor substrate with a gate insulating film therebetween, and source and drain regions formed on the opposite sides of the gate electrode, respectively.

As the field-effect transistor is miniaturized for high-density integration, the channel length of the gate electrodes decreases. Recently, the channel length has been reduced to about 0.2 $\mu$m. As the channel length decreases, the sectional area of the gate electrode decreases. This increases the electric resistance of the gate electrode. For suppressing increase of the electric resistance, field-effect transistors which employ gate electrodes made of metal have been used.

As compared with a gate electrode made of polycrystalline silicon, the gate electrode made of metal has a low thermal resistance. In a process of forming an interlayer insulating film after forming the gate electrode, therefore, disadvantages such as melting of the metal of the gate electrode occur due to a thermal treatment for forming the interlayer insulating film. Accordingly, a so-called replace gate process, in which the gate electrode is formed after forming the interlayer insulating film, is generally employed if the metal is used in the gate electrode.

Description will now be given on a field-effect transistor using metal in a gate electrode as well as a method of manufacturing it. FIG. 14 is a sectional view of a conventional semiconductor device using metal in the gate electrode. Referring to FIG. 14, an n-type source region 223s and an n-type drain region 223d spaced from each other are formed in a p-type semiconductor region of a silicon substrate 201. A gate electrode 240 located between source and drain regions 223s and 223d is formed on silicon substrate 201 with a gate insulating film 243 therebetween. Gate electrode 240 as well as source region 223s and drain region 223d form a field-effect transistor 200.

Source region 223s has a lightly doped impurity region 221s having a relatively low concentration of n-type impurity as well as a heavily doped impurity region 222s having a relatively high concentration of n-type impurity. Drain region 223d has a lightly doped impurity region 221d having a relatively low concentration n-type impurity as well as a heavily doped impurity region 222d having a relatively high concentration of n-type impurity. A p-type pocket region 211 is formed around lightly doped impurity region 221s. Also, p-type pocket region 211 is formed around lightly doped impurity region 221d. A counter dope region 228a which has a lower concentration of n-type impurity than source and drain regions 223s and 223d is formed between source and drain regions 223s and 223d, and is located near the surface of silicon substrate 201. A p-type channel dope region 212 is formed under counter dope region 228a.

Gate electrode 240 formed of a barrier layer 241 and a metal layer 242 is formed on a main surface 201a of silicon substrate 201 with a gate insulating film 243 formed of a silicon oxide film therebetween. A side wall oxide film 231 is formed on a sidewall of gate electrode 240. Gate electrode 240 is covered with an interlayer insulating film 232. Metal layer 242 is made of, e.g., copper, and barrier layer 241 is made of, e.g., titanium nitride.

A method of manufacturing the semiconductor device shown in FIG. 14 will now be described. FIGS. 15–21 are sectional views showing the method of manufacturing the semiconductor device shown in FIG. 14. Referring to FIG. 15, thermal oxidization is performed to from gate insulating film 243 on main surface 201a of silicon substrate 201. CVD (Chemical Vapor Deposition) is performed to form a polycrystalline silicon layer 251 on gate insulating film 243. Resist is applied to polycrystalline silicon layer 251, and is patterned into a predetermined configuration to from a resist pattern 271.

Referring to FIG. 16, polycrystalline silicon layer 251 and gate insulating film 243 masked with resist pattern 271 are patterned into a predetermined configuration. Using polycrystalline silicon layer 251 thus patterned as a mask, impurity such as boron is implanted into silicon substrate 201 to form pocket region 211. Then, impurity such as arsenic is implanted into silicon substrate 201 in a direction indicated by arrows 252 so that lightly doped impurity regions 221s and 221d are formed.

Referring to FIG. 17, a silicon oxide film is formed over silicon substrate 201 and polycrystalline silicon layer 251. Etch-back is effected entirely on this silicon oxide film to form sidewall oxide film 231 on the sidewall of polycrystalline silicon layer 251. Using side wall oxide film 231 and polycrystalline silicon layer 251 as a mask, impurity such as arsenic is implanted into silicon substrate 201 in a direction indicated by arrows 253 so that heavily doped impurity regions 222s and 222d are formed.

Referring to FIG. 18, interlayer insulating film 232 covering silicon substrate 201 is formed and flattened by CMP (Chemical Mechanical Polishing) to expose the surface of polycrystalline silicon layer 251. Thereafter, polycrystalline silicon layer 251 is removed by chemical etching. Thereby, an aperture 233 is formed.

Referring to FIG. 19, impurity such as boron is implanted into silicon substrate 201, which is masked with interlayer insulating film 232 and side wall oxide film 231, through aperture 233 in a direction indicated by arrows 255. Thereby, channel dope region 212 is formed.

Referring to FIG. 20, impurity such as arsenic is implanted through aperture 233, which is masked with interlayer insulating film 232 and side wall oxide film 231, in a direction indicated by arrows 256. Thereby, counter dope region 228a is formed.

Referring to FIG. 21, barrier metal layer 241 and metal layer 242 which fill aperture 233 and cover interlayer insulating film 232 are formed, and are flattened, e.g., by CMP to form gate electrode 240 shown in FIG. 14.

In recent years, the semiconductor devices have been increasingly miniaturized to a higher extent and field-effect transistors of the foregoing type employ the gate electrodes having a channel length shorter than about 0.2 μm. The field-effect transistor thus miniaturized suffers from several problems described below.

FIG. 22 shows problems which may arise in a conventional semiconductor device. Referring to FIG. 22, miniaturization of the semiconductor device causes variations in inner diameter (length) of aperture 233 used for forming the gate electrode. More specifically, the actual inner diameter of aperture 233 may deviate from a designed value, e.g., of 200 nm due to shift in position of the pattern in the patterning step. For example, even when each aperture 233 is designed to have an inner diameter equal to 200 μm, aperture 233a may have a length of $A_{41}$ equal to 180 μm, and aperture 233b may have a length of $A_{51}$ equal to 220 nm, as shown in FIG. 22. When there is a difference in size between apertures 233a and 233b, a difference occurs also in size between counter dope regions 228a and 228b, which are formed by implanting arsenic through apertures 233a and 233b in a direction of arrows 256, respectively. Counter dope region 228a has a length of 180 nm, and counter dope region 228b has a length of 220 nm.

A threshold voltage of field-effect transistor 200 shown in FIG. 14 depends on an impurity concentration of counter dope region 228a, a length $A_{61}$ of counter dope region 228 and other factors. Counter dope regions 228a and 228b shown in FIG. 22 have the same impurity concentrations and different lengths, respectively. Therefore, the field-effect transistor having counter dope region 228a and the field-effect transistor having counter dope region 228b have different threshold voltages, respectively. More specifically, the field-effect transistor having shorter counter dope region 228a has a lower threshold voltage. The field-effect transistor having longer counter dope region 228b has a higher threshold voltage. As described above, if counter dope regions 228a and 228b have actual lengths shifted from the designed values, respectively, variations occur in threshold voltage among the plurality of field-effect transistors formed on the semiconductor substrate, and therefore the reliability of the semiconductor device decreases.

As shown in FIG. 14, pocket regions 211 and channel dope region 212 are formed between source and drain regions 223s and 223d for preventing punch-through. As the channel length decreases, the punch-through is more likely to occur. Therefore, the concentration of boron implanted into pocket region 211 and channel dope region 212 has been further increasing. Therefore, a high electric field occurs between n-type lightly doped impurity region 221d, which forms drain region 223d, and the opposed regions, i.e., pocket region 211 and channel dope region 212. When a high electric field occurs near drain region 223d, so-called hot carriers are produced so that the threshold voltage of the field-effect transistor varies, and the reliability decreases.

For overcoming the problems of hot carriers described above, such a manner has been employed in step shown in FIG. 16 that nitrogen is implanted into silicon substrate 201 in a direction indicated by arrows 252. If nitrogen atoms are present near an interface between silicon substrate 201 and gate insulating film 243, implantation of hot carriers into the insulating film is suppressed, and deterioration of the semiconductor device can be prevented.

However, the nitrogen implanted in the above step deactivates boron in pocket region 211 and a portion of channel dope region 212 near the gate end, and thereby the resistance against punch-through decreases. Further, the nitrogen moves into counter dope region 228a so that variations in threshold voltage and other disadvantages occur, resulting in lowering of the reliability.

SUMMARY OF THE INVENTION

Accordingly, the invention has been made for overcoming the above problems, and an object of the invention is to provide a semiconductor device, in which a channel length can be reduced without reducing reliability.

Another object of the invention is to provide a semiconductor device, in which variations in threshold voltage among a plurality of field-effect transistors can be prevented, and thereby high reliability can be achieved.

Still another aspect of the invention is to provide a semiconductor device, in which implantation of hot carriers in the vicinity of a drain region is suppressed so that high reliability is achieved.

A semiconductor device according to an aspect of the invention includes a semiconductor substrate having a semiconductor region of a first conductivity type, and a first field-effect transistor formed in the semiconductor region. The first field-effect transistor includes a first gate electrode, a pair of first source and drain regions, and a first channel region. The first gate electrode is formed on the semiconductor region with a gate insulating film therebetween. The pair of source and drain regions are formed in the semiconductor region and on the opposite sides of the first gate electrode, respectively, and contain impurity of a second conductivity type in a first concentration. The first channel region is formed in the semiconductor region and under the first gate electrode, is in contact with the first source and drain regions, and contains impurity of the second conductivity type in a second concentration lower than the first concentration. The first channel region includes a pair of first lightly doped impurity regions being in contact with the first source and drain regions, respectively, and having a relatively low concentration of impurity of the second conductivity type, and a first heavily doped impurity region located between the paired first lightly doped impurity regions, and having a relatively high concentration of impurity of the second conductivity type.

In the semiconductor device having the above structure, the first channel region includes the lightly doped impurity region and the heavily doped impurity region. Therefore, by appropriately setting a ratio between the lightly and heavily doped impurity regions, the threshold voltage of the field-effect transistor can be set to an appropriate value. For example, the threshold voltage can be increased by increasing the ratio of the lightly doped impurity region and decreasing the ratio of the heavily doped impurity region. Further, the threshold voltage of the field-effect transistor can be decreased by decreasing the ratio of the lightly doped impurity region and increasing the ratio of the heavily doped impurity region. In the case where a plurality of field-effect transistors are present, the ratios between the lightly and heavily doped impurity regions may be appropriately determined, whereby the plurality of field-effect transistors can have uniform threshold voltages.

Preferably, the semiconductor device further includes a second field-effect transistor formed in the semiconductor region. The second field-effect transistor includes a second gate electrode, a pair of second source and drain regions, and a second channel region. The second gate electrode is formed on the semiconductor region with a gate insulating film therebetween. The pair of second source and drain regions are formed in the semiconductor region and on the opposite sides of the second gate electrode, respectively, and include impurity of the second conductivity type in a third concentration. The second channel region is formed in the semiconductor region and under the second gate electrode, is in contact with the second source and drain regions, and includes impurity of the second conductivity type in a fourth concentration lower than the third concentration. The second channel region includes a pair of a second lightly doped impurity regions and a second heavily doped impurity region. The pair of second lightly doped impurity regions are in contact with the second source and drain regions, respectively, and have a relatively low concentration of impurity of the second conductivity type. The second heavily doped impurity region is located between the paired second lightly doped impurity regions, and has a relatively high concentration of impurity of the second conductivity type.

In the semiconductor device having the structure described above, the first channel region includes the first lightly doped impurity region and the first heavily doped impurity region, and the second channel region includes the second lightly doped impurity region and the second heavily doped impurity region. Therefore, the ratio between the heavily and lightly doped impurity regions can be appropriately determined in each of the channel regions. Thereby, the first and second field-effect transistors can have the same threshold voltages.

Preferably, the first gate electrode has a relatively- small length. The second gate electrode has a relatively large length. The first channel has a length $A_1$. The first heavily doped impurity region has a length $A_2$. The second channel region has a length $A_3$ larger than length $A_1$. The second heavily doped impurity region has a length $A_4$. The lengths $A_1$, $A_2$, $A_3$ and $A_4$ satisfy a relationship of $A_4/A_3<A_2/A_1$.

$A_4/A_3$ represents a ratio of the length of the heavily doped impurity region in the second channel region, and $A_2/A_1$ represents a ratio of the length of the first heavily doped impurity region in the first channel region. Since the length $A_3$ of the second channel region is larger than the length $A_1$ of the first channel region, the channel length of the second field-effect transistor is larger than the channel length of the first field-effect transistor. However, the ratio $A_1/A_3$ of the second heavily doped impurity region in the second channel region is smaller than the ratio $A_2/A_4$ of the first heavily doped impurity region in the first channel region. Therefore, the second field-effect transistor has a larger channel length than the first field-effect transistor, and has the higher impurity concentration in the channel region so that the first and second field-effect transistors can have the substantially same threshold voltages.

Preferably, the first and second lightly doped impurity regions have the substantially equal lengths.

According to another aspect of the invention, a semiconductor device includes a semiconductor substrate having a semiconductor region of a p-type, and a field-effect transistor formed in the semiconductor region. The field-effect transistor includes a gate electrode, a pair of first impurity regions of an n-type, a second impurity region of the p-type, and a nitrogen region. The gate electrode is formed on the semiconductor region with a gate insulating film therebetween. The pair of first impurity regions of the n-type are formed in the semiconductor region and on the opposite sides of the gate electrode, respectively. The second impurity region of the p-type is formed in the semiconductor region, and is in contact with at least one of the first impurity regions. The nitrogen region is formed in the semiconductor region, has a high nitrogen concentration in the vicinity of a boundary between the second impurity region and at least one of the first impurity regions, and has a relatively low nitrogen concentration on a central side of the gate electrode.

In the semiconductor device having the structure described above, since the nitrogen concentration is high at the portion near the boundary between the second impurity region and one of the first impurity regions, implantation of hot carriers into an interlayer insulating film is suppressed in this portion so that deterioration of the semiconductor device can be suppressed. Since the nitrogen concentration is low on the central side of the gate electrode, deactivation of p-type impurity by the nitrogen can be prevented on the central side of the gate electrode. Accordingly, punch-through and others in this portion can be prevented. As a result, it is possible to provide the semiconductor device which can suppresses variations in threshold voltage, and has high reliability.

Preferably, one of the first impurity regions is a drain region. In this case, since generation of hot carriers can be prevented in the vicinity of the drain, the semiconductor device can have particularly high reliability.

According to still another aspect of the invention, a semiconductor device includes a semiconductor substrate having a semiconductor region of a first conductivity type, and a field-effect transistor formed in the semiconductor region. The field-effect transistor includes a gate electrode, a pair of first impurity regions, and a second impurity region. The gate electrode is formed on the semiconductor region with a gate insulating film therebetween. The pair of first impurity regions are formed in the semiconductor region and on the opposite sides of the gate electrode, respectively, and include impurity of a second conductivity type. The second impurity region is formed between the paired first impurity regions, and contains impurity of the first conductivity type. The second impurity region includes a lightly doped impurity region having a relatively low concentration of impurity of the first conductivity type, and located relatively close to one of the paired first impurity regions, and a heavily doped impurity region having a relatively high concentration of impurity of the first conductivity type, and being relatively remote from one of the paired first impurity regions.

In the semiconductor device having the above structure, the lightly doped impurity region having a low concentration of impurity of the first conductivity type is present in the position close to one of the first impurity regions containing the impurity of the second conductivity type. Therefore, a high electric field does not occur across this lightly doped impurity region and the first impurity region. As a result, generation of hot carriers can be prevented in this portion. Further, the heavily doped impurity region having a high concentration of impurity of the first conductivity type is present in a position remote from one of the first impurity regions. Therefore, punch-through between the paired first impurity regions can be prevented. As a result, the semiconductor device can have high reliability.

Preferably, one of the first impurity regions is a drain region.

In this case, since generation of hot carriers can be effectively prevented in the vicinity of the drain, it is possible to prevent the semiconductor device which can prevent variations in threshold voltage and others, and has high reliability.

A method of manufacturing a semiconductor device according to an aspect of the invention includes the following steps:

(1) Step of forming a pair of source and drain regions of a second conductivity type spaced from each other in a semiconductor region of a semiconductor substrate having a main surface and the semiconductor region of a first conductivity type.

(2) Step of forming on the semiconductor region an insulating layer provided with an aperture having a length of L and a depth of H, and reaching a portion of the semiconductor region between the paired source and drain regions.

(3) Step of implanting impurity of the second conductivity type through the aperture into the semiconductor region in directions directed from the source region toward the drain region and from the drain region toward the source region, respectively, at an angle θ satisfying a relationship expressed by ($8° \leq \theta \leq \tan^{-1}(L/2H)$) with respect to the main surface of the semiconductor substrate, and thereby forming a channel region including a pair of lightly doped impurity regions having a relatively low concentration of impurity of the second conductivity type and being in contact with the source and drain regions, respectively, and a heavily doped impurity region located between the paired lightly doped impurity regions and having a relatively high concentration of impurity of the second conductivity type.

(4) Step of forming a gate electrode filling the aperture and located on the semiconductor region with a gate insulating film therebetween.

According to the method of manufacturing the semiconductor device including the above steps, since the impurity of the second conductivity type is implanted twice into the central portion of the channel region, the heavily doped impurity region having a relatively high concentration of the impurity of the second conductivity type is formed. Further, the impurity of the second conductivity type is implanted only once into the peripheral portion of the channel region. Therefore, the lightly doped impurity region having a relatively low concentration of impurity of the second conductivity type is formed. As described above, the impurity of the second conductivity type is implanted in the directions forming the predetermined angle to the main surface of the semiconductor substrate, the lightly doped impurity region having a relatively low impurity concentration and the heavily doped impurity region having a relatively high impurity concentration can be formed in a self-aligning manner. As a result, it is possible to provide the semiconductor device allowing adjustment of the threshold voltage without particularly requiring an additional step.

According to another aspect of the invention, a method of manufacturing a semiconductor device includes the following steps:

(1) Step of forming a pair of first impurity regions of an n-type spaced from each other in a semiconductor region of a semiconductor substrate having a main surface and the semiconductor region of a p-type.

(2) Step of forming on the semiconductor region an insulating layer provided with an aperture having a length of L and a depth of H, and reaching a portion of the semiconductor region between the paired first impurity regions.

(3) Step of forming in the semiconductor region a second impurity region of the p-type being in contact with at least one of the first impurity regions.

(4) Step of implanting nitrogen through the aperture into the semiconductor region in a direction directed toward one of the paired first impurity regions from the other at an angle θ satisfying a relationship expressed by ($\tan^{-1}(L/2H) \leq \theta \leq \tan^{-1}(L/H)$) with respect to the main surface of the semiconductor substrate, and thereby forming a nitrogen region having a relatively high nitrogen concentration in the vicinity of a boundary between the second impurity region and one of the first impurity regions as well as a relatively low nitrogen concentration on the central side of the gate electrode.

(5) Step of forming a gate electrode filling the aperture and located on the semiconductor region with a gate insulating film therebetween.

According to the method of manufacturing the semiconductor device including the above steps, the nitrogen is implanted into the semiconductor region at the predetermined angle θ with respect to the main surface of the semiconductor substrate. This forms the nitrogen region having the relatively high nitrogen concentration in the vicinity of the boundary between the second impurity region and one of the second impurity regions as well as the relatively low nitrogen concentration on the central side of the gate electrode. Since this nitrogen region has the high nitrogen concentration in the vicinity of the boundary between the second impurity region and one of the first impurity regions, generation of hot carriers is prevented. Since the nitrogen region has a low nitrogen concentration on the central side of the gate electrode, the p-type impurity in this central portion is not deactivated so that the punch-through resistance does not lower. According to the invention, therefore, it is possible to provide the semiconductor device having high reliability without particularly requiring an additional step.

According to still another aspect of the invention, a method of manufacturing a semiconductor device includes the following steps:

(1) Step of forming a pair of first impurity regions of a second conductivity type spaced from each other in a semiconductor region of a semiconductor substrate having a main surface and the semiconductor region of a first conductivity type.

(2) Step of forming on the semiconductor region an insulating layer provided with an aperture having a length of L and a depth of H, and reaching a portion of the semiconductor region between the paired first impurity regions.

(3) Step of implanting impurity of the first conductivity type through the aperture into the semiconductor region in a direction directed from one of the paired first impurity regions toward the other at an angle θ satisfying a relationship expressed by ($8° \leq \theta \leq \tan^{-1}(L/2H)$) with respect to the main surface of the semiconductor substrate, and thereby forming a second impurity region including a lightly doped impurity region having a relatively low concentration of impurity of the first conductivity type and located relatively close to one of the paired first impurity regions, and a heavily doped impurity region having a relatively high concentration of impurity of the first conductivity type and located relatively remote from one of the paired first impurity regions.

(4) Step of forming a gate electrode filling the aperture and located on the semiconductor region with a gate insulating film therebetween.

According to the method of manufacturing the semiconductor device described above, the second impurity region having the lightly and heavily doped impurity regions is formed in a self-aligning manner by implanting the impurity of the first conductivity type in a direction forming the angle θ with respect to the main surface of the semiconductor substrate. Since the lightly doped impurity region having a relatively low concentration of impurity of the first conductivity type is formed in the portion near the first impurity region, occurrence of a high electric field can be prevented in the vicinity of the first impurity region. As a result, it is possible to provide the semiconductor device, in which hot carriers do not occur, and high reliability is ensured, without particularly requiring an additional step. Further, the heavily doped impurity region having a relatively high concentration of impurity of the first conductivity type is formed in a portion remote from one of the first impurity regions. Therefore, occurrence of punch-through can be prevented in this remote portion. As a result, it is possible to provide the semiconductor device having high reliability without particularly requiring an additional step.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

First Embodiment

Figure 1:
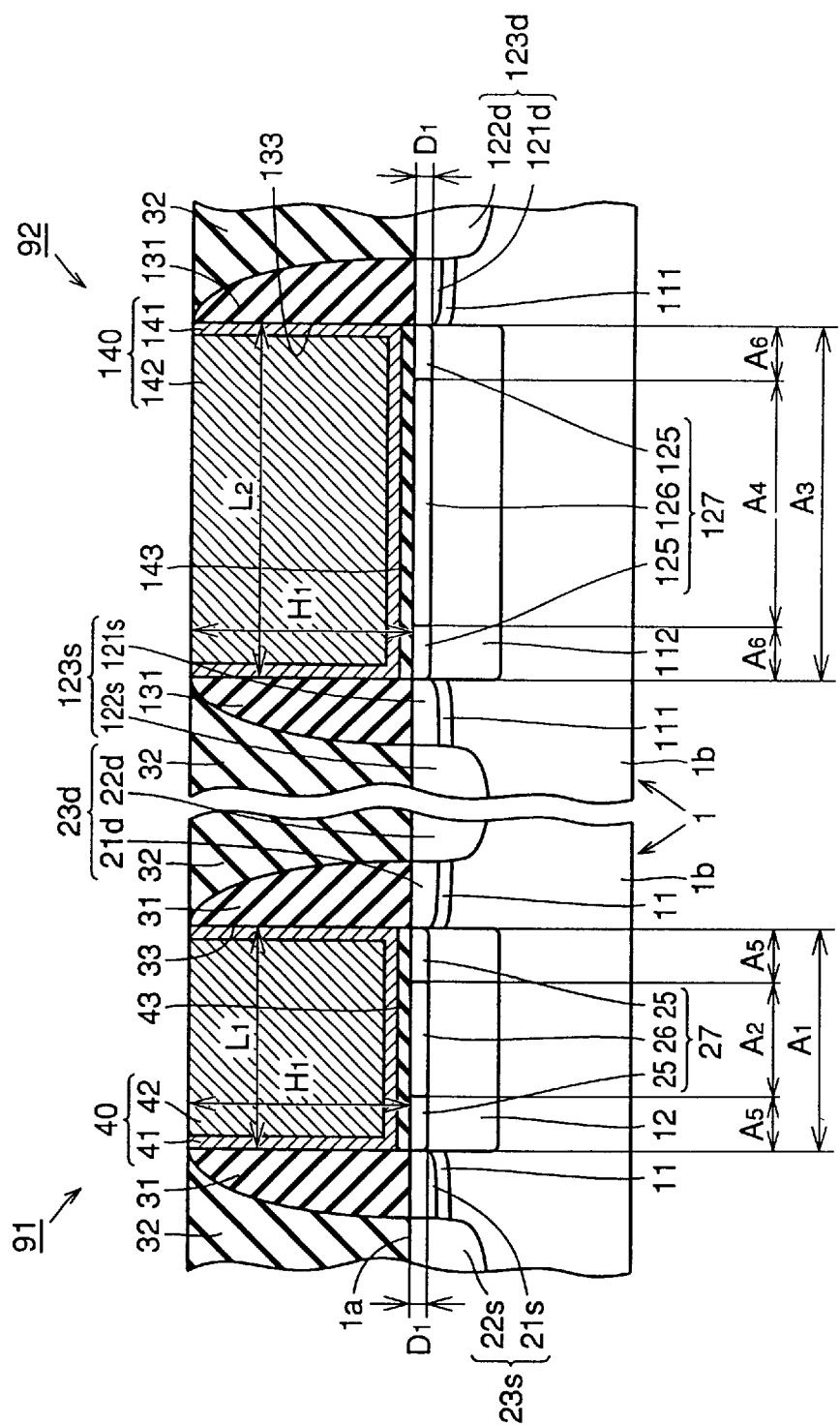
FIG. 1 is a cross section of a semiconductor device according to a first embodiment of the invention.

Referring to FIG. 1, a semiconductor device according to a first embodiment of the invention includes a semiconductor substrate 1 having a p-type semiconductor region 1b as well as field-effect transistors 91 and 92, which are formed in semiconductor region 1b and serve as first and second field-effect transistors, respectively. Field-effect transistor 91 has a gate electrode 40 serving as a first gate electrode, source and drain regions 23s and 23d serving a pair of first source and drain regions, respectively, and a channel region 27 serving as a first channel region. Gate electrode 40 is formed on semiconductor region 1b with a gate insulating film 43 therebetween. Source region 23s and drain region 23d are formed in semiconductor region 1b, and are located on the opposite sides of gate electrode 40, respectively. Each of source and drain regions 23s and 23d contains impurity of an n-type in a first concentration. Channel region 27 is formed in a portion of semiconductor region 1b under gate electrode 40, and is in contact with source and drain regions 23s and 23d. Channel region 27 contains impurity of n-type in a second concentration lower than the first concentration. Channel region 27 includes lightly doped impurity regions 25 which are in contact with source and drain regions 23s and 23d, respectively, have a relatively low concentration of n-type impurity and serve as a pair of first lightly doped impurity regions, respectively, and a heavily doped impurity region 26 which is located between paired lightly doped impurity regions 25, has a relatively high concentration of n-type impurity and serves as a first heavily doped impurity region.

Field-effect transistor 92 includes a gate electrode 140 serving as a second gate electrode, source and drain regions 123s and 123d which serve as a pair of second source and drain regions, respectively, and a channel region 127 serving as a second channel region. Gate electrode 140 is formed on semiconductor region 1b with a gate insulating film 143 therebetween. Paired source and drain regions 123s and 123d are formed in portions of semiconductor region 1b on the opposite sides of gate electrode 140, respectively, and contain n-type impurity in a third concentration. Second channel region 127 is formed in a portion of semiconductor region 1b under gate electrode 140, is in contact with source and drain regions 123s and 123d, and contains n-type impurity in a fourth concentration lower than the third concentration. Channel region 127 includes lightly doped impurity regions 125 which are in contact with source and drain regions 123s and 123d, respectively, have a relatively low concentration of n-type impurity, and serves as a pair of lightly doped impurity regions 125, respectively, and heavily doped impurity region 126 which is located between paired lightly doped impurity regions 125, has a relatively high impurity concentration of n-type impurity, and serves as a second heavily doped impurity region.

Source regions 23s and 123s include lightly doped impurity regions 21s and 121s each having a relatively low concentration of n-type impurity, and heavily doped impurity regions 22s and 122s each having a relatively high concentration of n-type impurity, respectively. Drain regions 23d and 123d include lightly doped impurity regions 21d and 121d having a relatively low impurity concentration, and also include heavily doped impurity regions 22d and 122d having a relatively high impurity concentration, respectively. In the vicinity of lightly doped impurity regions 21s, 21d and 121s and 121d, p-type pocket regions 11 and 111 are formed for preventing punch-through. Channel region 27 is formed between source and drain regions 23s and 23d. Channel region 127 is formed between source and drain regions 123s and 123d. Channel regions 27 and 127 have heavily doped impurity regions 26 and 126 located at their central portions as well as lightly doped impurity regions 25 and 125 located at their peripheral portions, respectively. Channel dope regions 12 and 112 are formed in contact with channel regions 27 and 127 as well as pocket layers 11 and 111, respectively.

Gate electrodes 40 and 140 are formed on main surface 1a of silicon substrate 1 with gate insulating films 43 and 143 made of silicon oxide films therebetween, respectively. Gate electrodes 40 and 140 are formed of barrier layers 41 and 141 made of titanium nitride as well as metal layers 42 and 142 made of copper, respectively. Gate electrodes 40 and 140 extend in a direction perpendicular to the sheet of the drawing.

Side wall oxide films 31 and 131 made of silicon oxide films are formed on side walls of gate electrodes 40 and 140, respectively. Each of side walls 31 and 131 has a length or thickness which increases as the position moves toward main surface 1a of silicon substrate 1. An interlayer insulating film 32 which is made of a silicon oxide film and serves as an interlayer insulating film is formed on main surface 1a of silicon substrate 1. The upper surface of interlayer insulating film 32 is flush with the upper surfaces of gate electrodes 40 and 140.

Channel region 27 has a length $A_1$ of 180 nm. Heavily doped impurity region 26 has a length $A_2$ if 50 nm. Lightly doped impurity region has a length $A_5$ of 65 nm. Channel region 27 has a depth $D_1$ of 30 nm. Aperture 33 has a length $L_1$ of 180 nm. Aperture 33 has a depth $H_1$ of 200 nm.

Channel region 127 has a length $A_3$ of 220 nm. Heavily doped impurity region 126 has a length $A_4$ of 90 nm. Lightly doped impurity region 125 has a length $A_6$ of 65 nm. Aperture 133 has a length $L_2$ of 220 nm.

Gate electrode 40 has a relatively small length. Gate electrode 140 has a relatively large length. Channel region 27 has length $A_1$. Heavily doped impurity region 26 has length $A_2$. Channel region 127 has length $A_3$ larger than length $A_1$. Heavily doped impurity region 126 has length $A_4$. Lengths $A_1$, $A_2$, $A_3$ and $A_4$ satisfy a relationship of $A_4/A_3 < A_2/A_1$.

Semiconductor region 1b contains boron in a concentration of $1 \times 10^{17}/cm^3$. Arsenic serving as the impurity is present in lightly doped impurity regions 21s, 21d, 121s and 121d in the concentration of $4 \times 10^{19}/cm^3$. Arsenic serving as the impurity is present in heavily doped impurity regions 22s, 22d, 122s and 122d in the concentration of $4 \times 10^{20}/cm^3$. Boron serving as the impurity is present in pocket regions 11 and 111 in the concentration of $1.5 \times 10^{18}/cm^3$. Arsenic serving as the impurity is present in heavily doped impurity regions 26 and 126 in the concentration of $4 \times 10^{18}/cm^3$. Arsenic serving as the impurity is present in lightly doped impurity regions 25 and 125 in the concentration of $2 \times 10^{18}/cm^3$. Boron serving as the impurity is present in channel dope regions 12 and 112 in the concentration of $4 \times 10^{17}/cm^3$.

Figure 2:
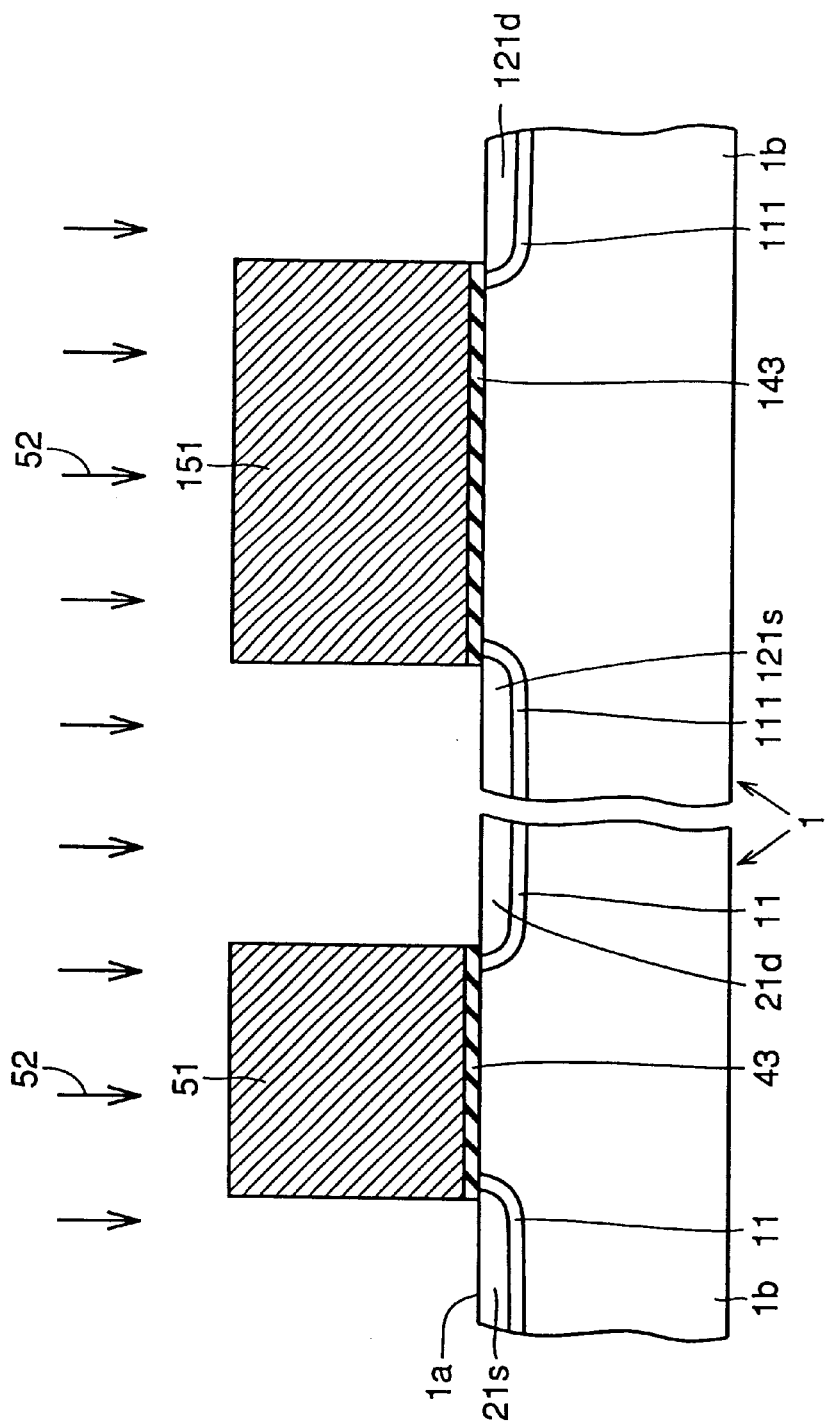
FIGS. 2 to 6 are cross sections showing first to fifth steps in a method of manufacturing the semiconductor device shown in FIG. 1, respectively.

A method of manufacturing a semiconductor device shown in FIG. 1 will now be described. Referring to FIG. 2, a thermal oxidization method is performed to form a thermal oxide film on main surface 1a of silicon substrate 1. A polycrystalline silicon layer is deposited as a dummy gate on the thermal oxide film. Resist is applied to the polycrystalline silicon layer, and is patterned into a predetermined configuration. Thereby, a resist pattern is formed. The polycrystalline silicon layer and the thermal oxide film masked with the resist pattern is etched to form polycrystalline silicon layers 51 and 151 as well as gate insulating films 43 and 143. Using polycrystalline silicon layers 51 and 151 as a mask, boron is implanted in a direction indicated by arrows 52 into p-type semiconductor region 1b of silicon substrate 1 with conditions of an implantation energy of 10–30 keV and an implantation dose of $5 \times 10^{12}$–$5 \times 10^{13}/cm^2$. Thereby, pocket region 11 is formed. Then, arsenic is implanted in the direction indicated by arrows 52 into semiconductor region 1b of silicon substrate 1 with conditions of an implantation energy of 5–20 keV and an implantation dose of $1 \times 10^{14}$–$2 \times 10^{15}/cm^2$. Thereby, lightly doped impurity regions 21s, 21d, 121s and 121d are formed.

Figure 3:
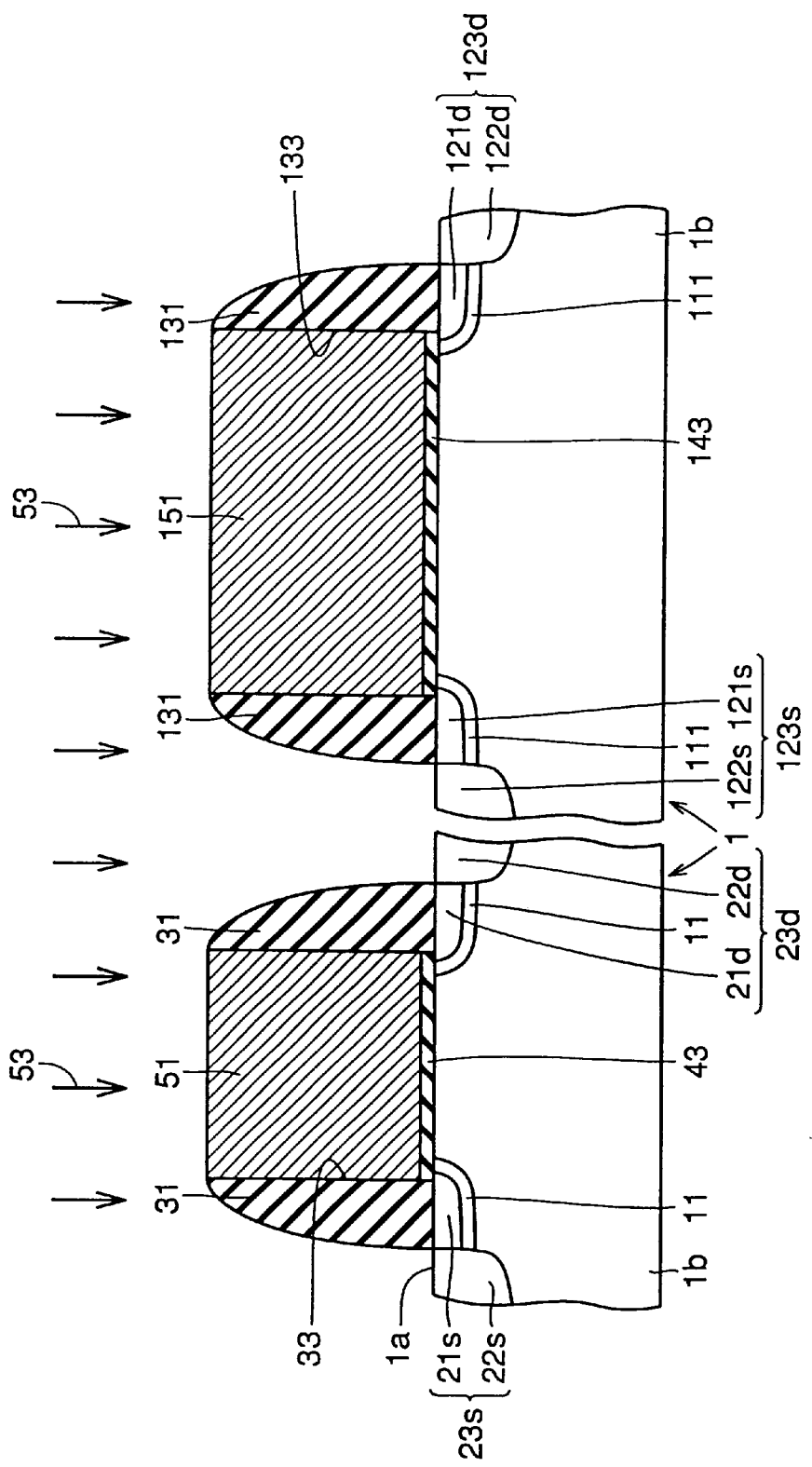

Referring to FIG. 3, processing is performed to form a silicon oxide film covering polycrystalline silicon layers 51 and 151. Etch-back is effected entirely on the silicon oxide film to form side wall oxide films 31 and 131. Using side wall oxide films 31 and 131 as well as polycrystalline silicon films 51 and 151 as a mask, arsenic is implanted in a direction indicated by arrows 53 into semiconductor region 1b of semiconductor substrate 1 with conditions of an implantation energy of 30–60 keV and an implantation dose of $2 \times 10^{15}$–$6 \times 10^{15}/cm^3$. Thereby, heavily doped impurity regions 22s, 22d, 122s and 122d are formed.

Figure 4:
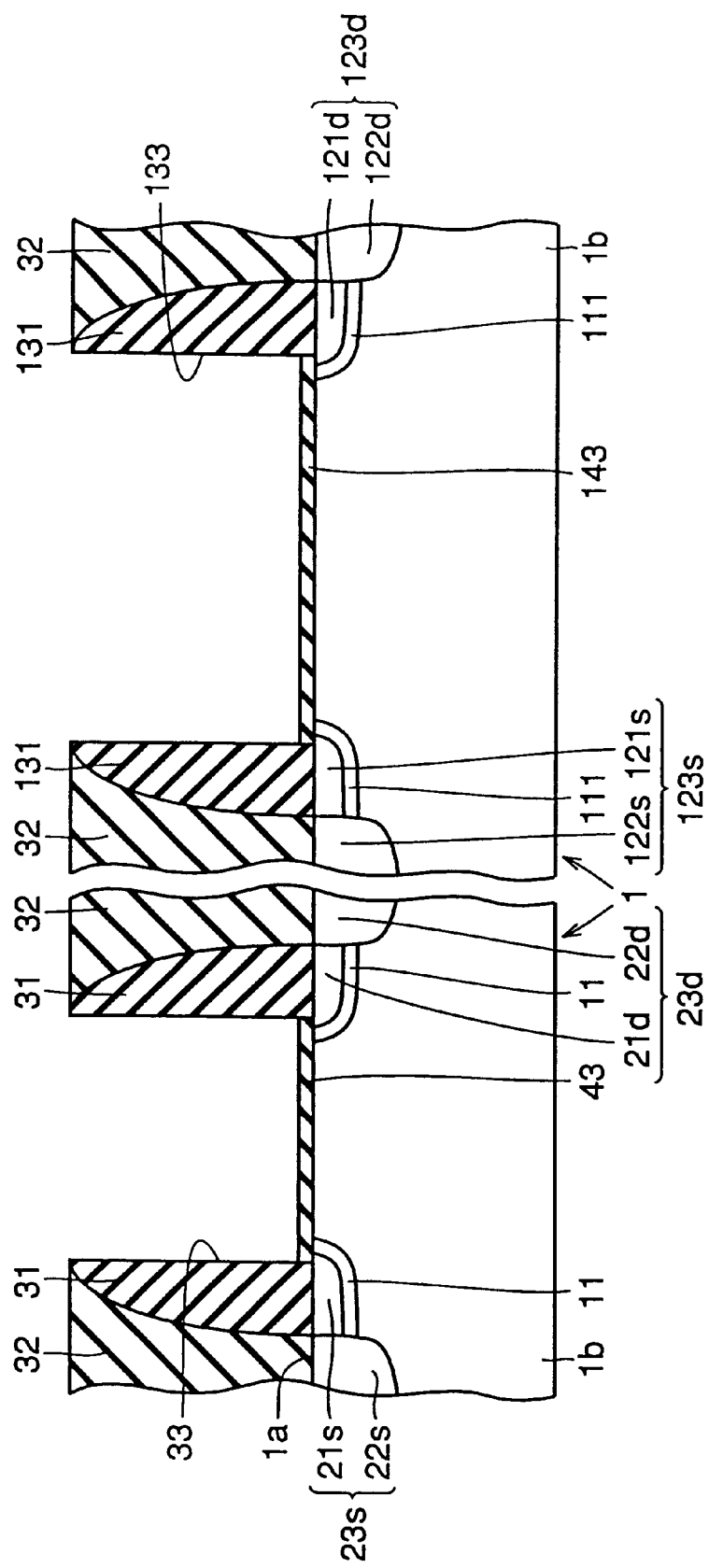

Referring to FIG. 4, a silicon oxide film is deposited over main surface 1a of silicon substrate 1. This silicon oxide film is flattened, e.g., by CMP to form interlayer insulating film 32. After forming interlayer insulating film 32, polycrystalline silicon layers 51 and 151 are removed to form apertures 33 and 133.

Figure 5:
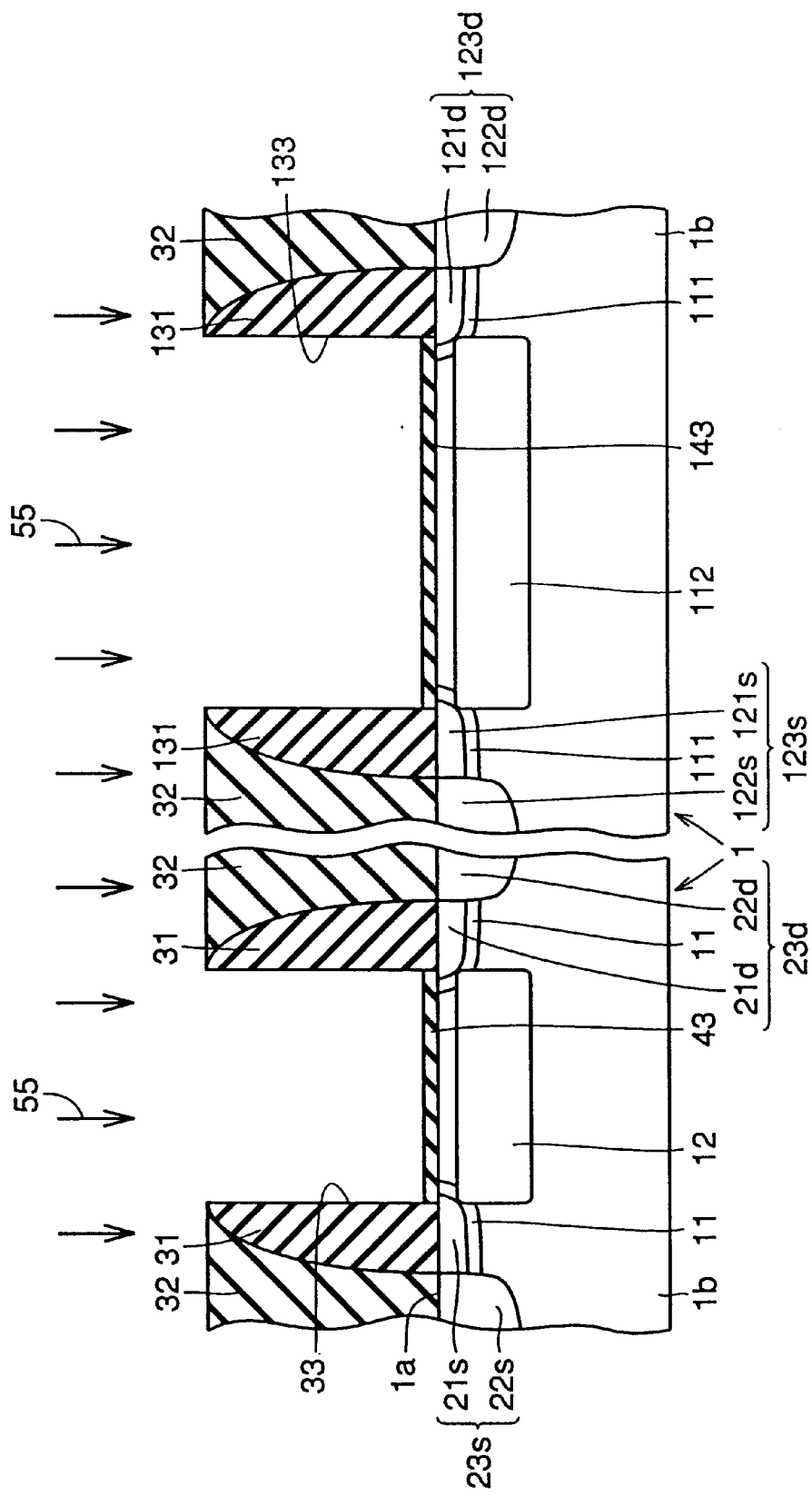

Referring to FIG. 5, boron is implanted in a direction indicated by arrows 55 into semiconductor region 1b of silicon substrate 1 with conditions of an implantation energy of 10–50 keV and an implantation dose of $1 \times 10^{12}$–$3 \times 10^{13}/cm^2$. Thereby, channel dope regions 12 and 112 are formed.

Figure 6:
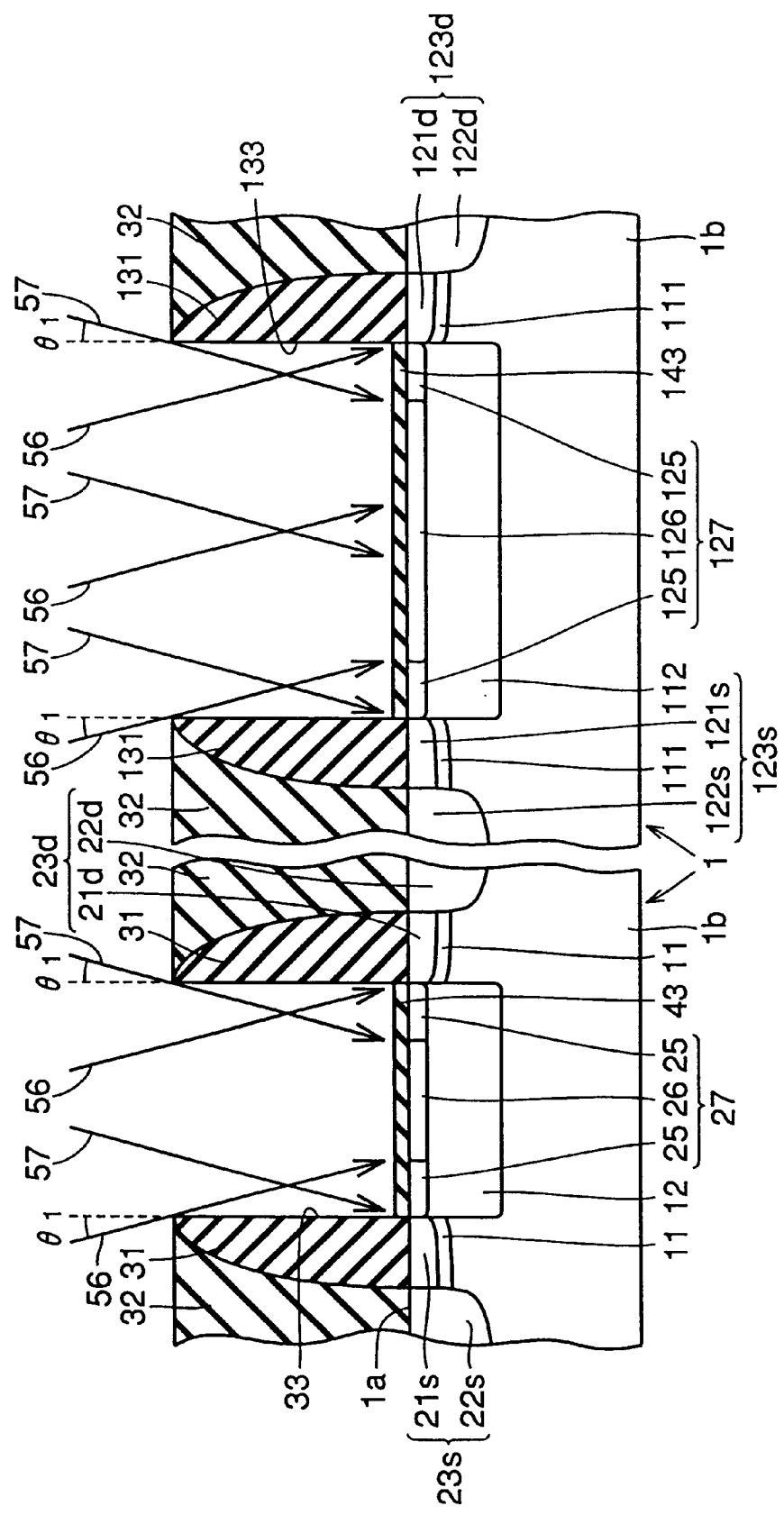

Referring to FIG. 6, arsenic is implanted in a direction, which forms an angle $\theta_1$ (18°) with respect to the normal of main surface 1a of silicon substrate 1, and is directed from source regions 23s and 123s toward drain regions 23d and 123d, respectively, i.e., in the direction indicated by arrows 56 with conditions of an implantation energy of 12 keV and an implantation dose of $2 \times 10^{13}/cm^2$. Then, arsenic is implanted in a direction, which forms an angle $\theta_1$ (18°) with respect to the normal of main surface 1a of silicon substrate 1, and is directed from drain regions 23d and 123d toward source regions 23s and 123s, respectively, i.e., in the direction indicated by arrows 57 with conditions of an implantation energy of 12 keV and an implantation dose of $2 \times 10^{13}/cm^2$. These steps form channel regions 27 and 127, which are formed of lightly doped impurity regions 25 and 125 as well as heavily doped impurity regions 27 and 127, respectively. The central portion of channel region 27 contains the arsenic in a high concentration because the arsenic is implanted two times into the central portion by the implantation in the direction of arrows 56 and the implantation in the direction of arrows 57. The peripheral portion of channel region 27 contains the arsenic in a low concentration because the arsenic is implanted into the peripheral portion only one time in the direction indicated by arrows 56 or arrows 57.

Referring to FIG. 1, processing is performed to form barrier layer 41 made of titanium nitride and metal layer 42 made of copper so that apertures 33 and 133 are filled thereby. In this manner, field-effect transistors 91 and 92 shown in FIG. 1 are completed.

In field-effect transistors 91 and 92 thus formed, channel regions 27 and 127 formed by oblique implantation have heavily doped impurity regions 26 and 126, which are formed by arsenic implantation performed two times, and have the impurity concentration, e.g., of $C_1$, and also have lightly doped impurity regions 25 and 125, which are formed by impurity implantation performed only one time, and therefore have the impurity concentration of (½) $C_1$. Assuming that each of apertures 33 and 133 has the length of L and the depth of H, each of lightly doped impurity regions 25 and 125 has a length of H·tanθ, and each of heavily doped impurity region has a length of (L−2H·tanθ). According to these relationships, channel region 27 has the average concentration of arsenic equal to $C_1$ (1−$H_1/L_1$) tanθ. Further, channel region 127 has the average concentration of arsenic equal to $C_1 (1-(H_1/L_2) \tan\theta)$. Since $L_1$ is smaller than $L_2$, the average arsenic concentration of channel region 127 is higher than the average arsenic concentration of channel region 27. The channel length of field-effect transistor 92 is longer than the channel length of field-effect transistor 91. Therefore, field-effect transistor 92 has the channel region which is longer in channel length and higher in impurity concentration than field-effect transistor 91. Thereby, field-effect transistors 91 and 92 have the substantially same threshold voltages. Accordingly, the field-effect transistors having the substantially equal threshold voltages can be obtained in a self-aligning manner even if the channel lengths thereof are different from each other.

Implantation angle θ is not restricted to the values in the foregoing embodiment and may be adjusted within a range of $8° \leq \theta \leq \tan (L/2H)$. More specifically, channel length L and depth H may be equal to 160 nm and 200 nm, respectively, in which case angle θ can be in a range of $8° \leq \theta \leq 22°$. Angle θ is not smaller than 8° because the angle θ smaller than 8° cannot cause a sufficient change in average concentration of the channel region depending on the implantation angle so that the effect of the invention cannot be achieved. Implantation angle θ is not larger than $\tan^{-1}(L/2H)$ because a value larger that it cannot form the heavily doped impurity region in the central portion of the channel region. In a practical process, it is necessary to cancel the lowering of the threshold voltage due to a short channel effect and further the threshold voltage itself must be set to an intended value. For this, such a manner may be employed that angle θ defined between the normal of main surface $1a$ of silicon substrate 1 and the implantation direction is set to an appropriate value, and a part of the portion forming the counter dope layer is not subjected to oblique implantation, and is subjected to a vertical ion implantation similarly to the prior art. In this case, channel regions having a uniform concentration independently of the length of gate are formed, and channel regions 27 and 127 shown in FIG. 1 are formed so that variations in threshold voltage are prevented. At the same time, the threshold voltage itself can be set to an intended value.

Second Embodiment

A semiconductor device according to a second embodiment of the invention includes semiconductor substrate 1 having p-type semiconductor region $1b$, and a field-effect transistor 93 formed in semiconductor region $1b$. Field-effect transistor 93 has gate electrode 40, source and drain regions $23s$ and $23d$ serving as a pair of first impurity regions of n-type, pocket regions 11, channel dope region 12 which serves together with pocket regions 11 as the second impurity regions of p-type, and nitrogen regions 63. Gate electrode 40 is formed on semiconductor region $1b$ with gate insulating film 43 therebetween. Source region $23s$ and drain region $23d$ are formed in portions of semiconductor region $1b$ on the opposite sides of gate electrode 40. Pocket region 11 and channel dope region 12 are formed in semiconductor region $1b$, and are in contact with at least one of source and drain regions $23s$ and $23d$. Each nitrogen region 63 is formed at a portion of semiconductor region $1b$ under gate electrode 40. Nitrogen region 63 has a heavily doped nitrogen region 61 which has a relatively high concentration of nitrogen, and is located in the vicinity of the interface defined by one of source and drain regions $23s$ and $23d$, with respect to pocket region 11 and channel dope region 12. Nitrogen region 63 also has a lightly doped nitrogen region 62 which has a relatively low concentration of nitrogen, and is located on the central side of gate electrode 40. Nitrogen region 63 has a depth $D_2$ of 30 nm. The nitrogen concentration of heavily doped nitrogen region 61 is equal to $3 \times 10^{20}/cm^3$. The nitrogen concentration of lightly doped nitrogen region 62 is equal to $1 \times 10^{19}/cm^3$. Heavily doped nitrogen region 61 has a length $A_{13}$ of 40 nm. A channel region 28 (counter dope region) doped with arsenic serving as n-type impurity is formed between paired nitrogen regions 63. The arsenic concentration of channel region 28 is equal to $4 \times 10^{17}/cm^3$. A total length $A_{12}$ of channel region 28 and lightly doped nitrogen region 62 is equal to 100 nm.

Aperture 33 filled with gate electrode 40 has a length $L_3$ of 160 nm. Aperture 33 has a depth $H_3$ of 200 nm.

A method of manufacturing the semiconductor device shown in FIG. 7 will now be described. Referring first to FIG. 8, processing similar to that of the embodiment shown in FIGS. 2 to 4 is performed to form source region $23s$, drain region $23d$, pocket regions 11, channel dope region 12, gate insulating film 32, side wall oxide film 31 and interlayer insulating film 32 at or on silicon substrate 1. Using interlayer insulating film 32 and side wall oxide film 31 as a mask, arsenic is implanted in a direction indicated by arrows 58 into semiconductor region $1b$ of silicon substrate 1 with conditions of an implantation energy of 60 keV and an implantation dose of $1 \times 10^{13}/cm^2$. Thereby, channel region 28 is formed.

Figure 9:
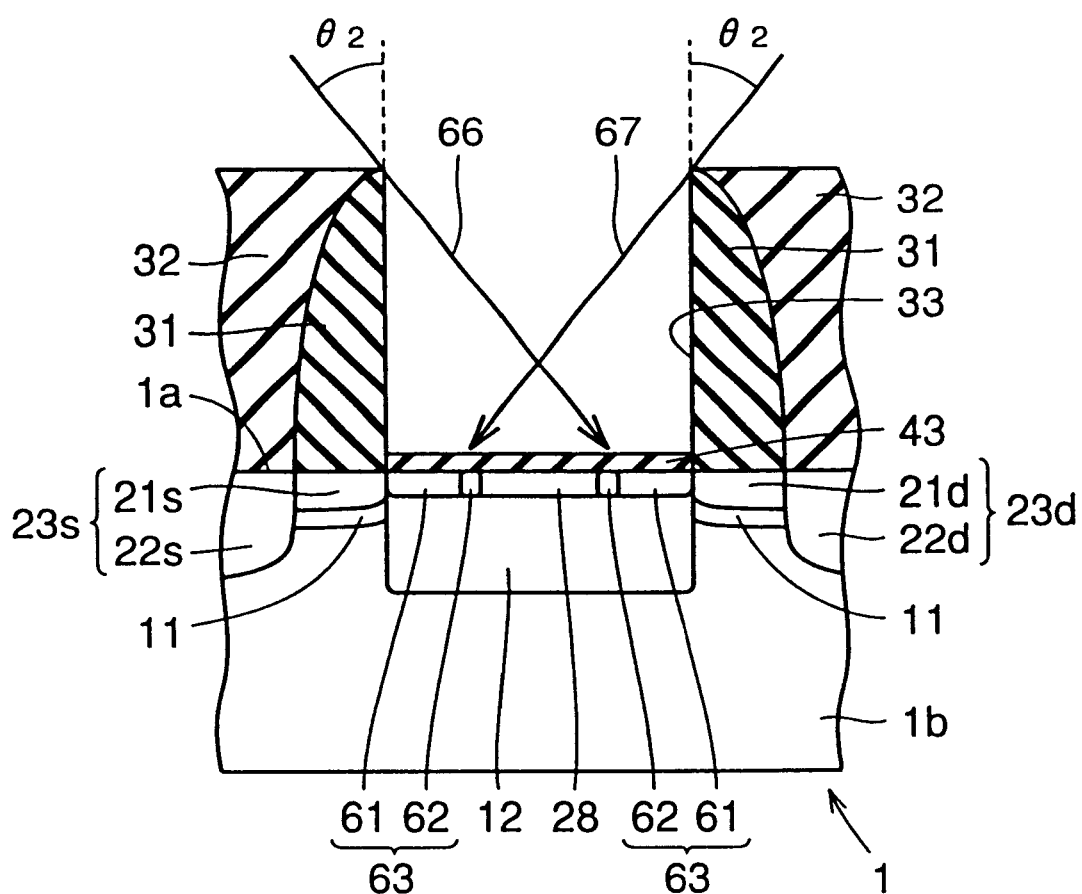

Referring to FIG. 9, nitrogen is implanted in a direction, which forms an angle $\theta_2$ (30°) with respect to the normal of main surface $1a$ of silicon substrate 1, and is directed from source region $23s$ toward drain region $23d$, i.e., in the direction indicated by arrows 66 with conditions of an implantation energy of 5–10 keV and an implantation dose of $5 \times 10^{14}$–$4 \times 10^{15}/cm^2$. Then, nitrogen is implanted into semiconductor region $1b$ in a direction, which forms an angle θ (30°) with respect to the normal of main surface $1a$ of silicon substrate 1, and is directed from drain region $23d$ toward source region $23s$, i.e., in the direction indicated by arrows 67 with conditions of an implantation energy of 5–10 keV and an implantation dose of $5 \times 10^{14}$–$4 \times 10^{15}/cm^2$. These steps form nitrogen regions 63 each having heavily doped nitrogen region 61 of a relatively high nitrogen concentration and lightly doped nitrogen region 62 of a relatively low nitrogen concentration.

Figure 7:
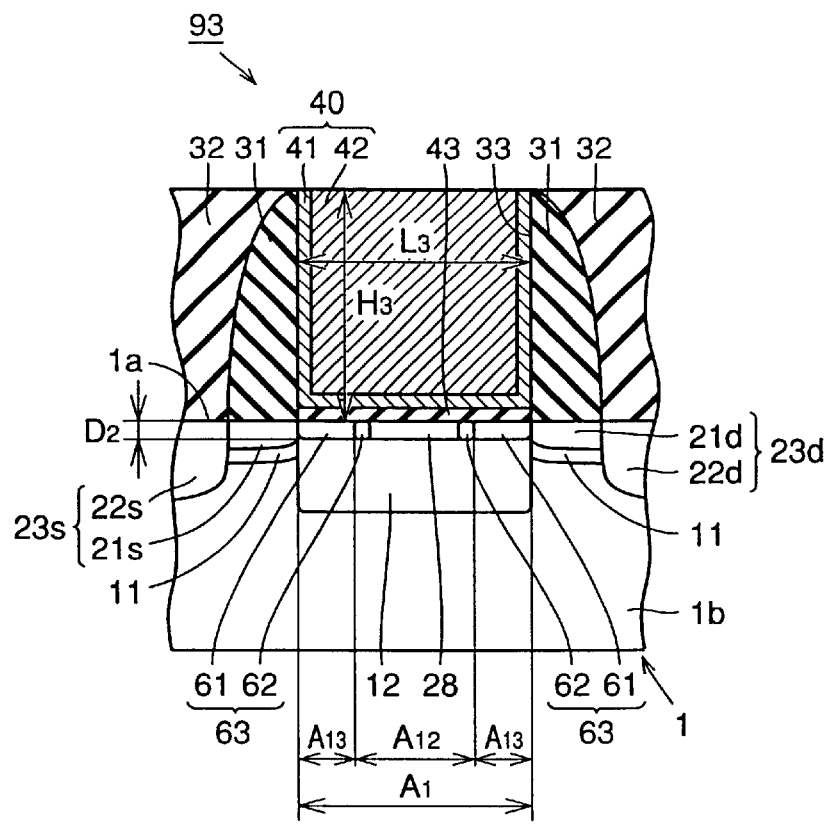
FIG. 7 is a cross section of a semiconductor device according to a second embodiment of the invention.
Figure 8:
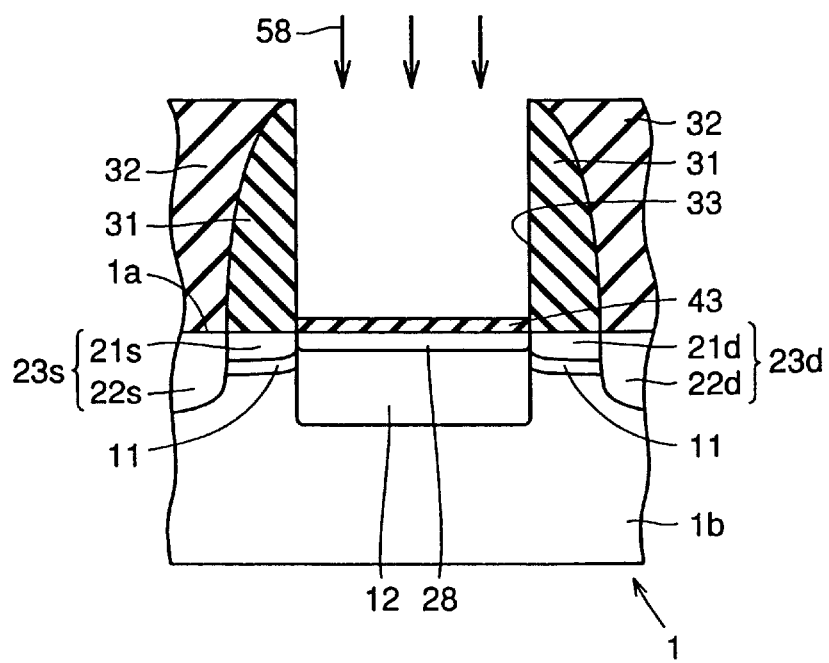
FIGS. 8 and 9 are cross sections showing first and second steps in a method of manufacturing the semiconductor device shown in FIG. 7, respectively.

Referring to FIG. 7, processing is performed to form gate electrode 40 which fills aperture 33 and is formed of barrier layer 41 and metal layer 42. Thereby, the semiconductor device shown in FIG. 7 is completed.

According to the above semiconductor device, heavily doped nitrogen region 61 having a relatively high nitrogen concentration is present in the vicinity of the interface defined by each of source and drain regions $23s$ and $23d$ with respect to pocket region 11 and channel dope region 12, and lightly doped nitrogen region 62 having a relatively low nitrogen concentration is formed on the central side of gate electrode 40. Therefore, hot carriers which are generated in a high electric field region are effectively prevented from being implanted into the insulating film, and deterioration of the semiconductor device can be prevented. In particular, it is possible to suppress concentrating of the electric field in the vicinity of drain region $23d$ so that generation of hot carriers can be effectively prevented. Further, variations in threshold voltage do not occur because lightly doped nitrogen region 62 having a relatively low nitrogen concentration is present on the central side of gate electrode 40. Since boron under the central portion of gate electrode 40 is not deactivated, occurrence of punch-through can be prevented.

Nitrogen region 63 formed of lightly and heavily doped impurity regions 62 and 63 described above is formed in a self-aligning manner by oblique implantation as shown in FIG. 9. Therefore, the semiconductor device having high reliability can be manufactured without particularly adding a new step.

Implantation angle θ must satisfy the relationship expressed by $\tan^{-1}$ (L/2H)$\leq$θ$\leq$$\tan^{-1}$ (L/H). Implantation angle θ must be equal to or larger than $\tan^{-1}$ (L/2H) for the following reason. If implantation angle θ were smaller than $\tan^{-1}$ (L/2H), a region of a high nitrogen concentration would present in the central portion of the channel region, and it would be impossible to form portions of a high nitrogen concentration in the opposite ends of the channel region. Further, implantation angle θ must be equal to or smaller than $\tan^{-1}$ (L/H) for the following reason. If implantation angle θ were larger than $\tan^{-1}$ (L/2H), nitrogen would not be implanted into any portion so that the nitrogen region would not be formed.

Third Embodiment

Figure 10:
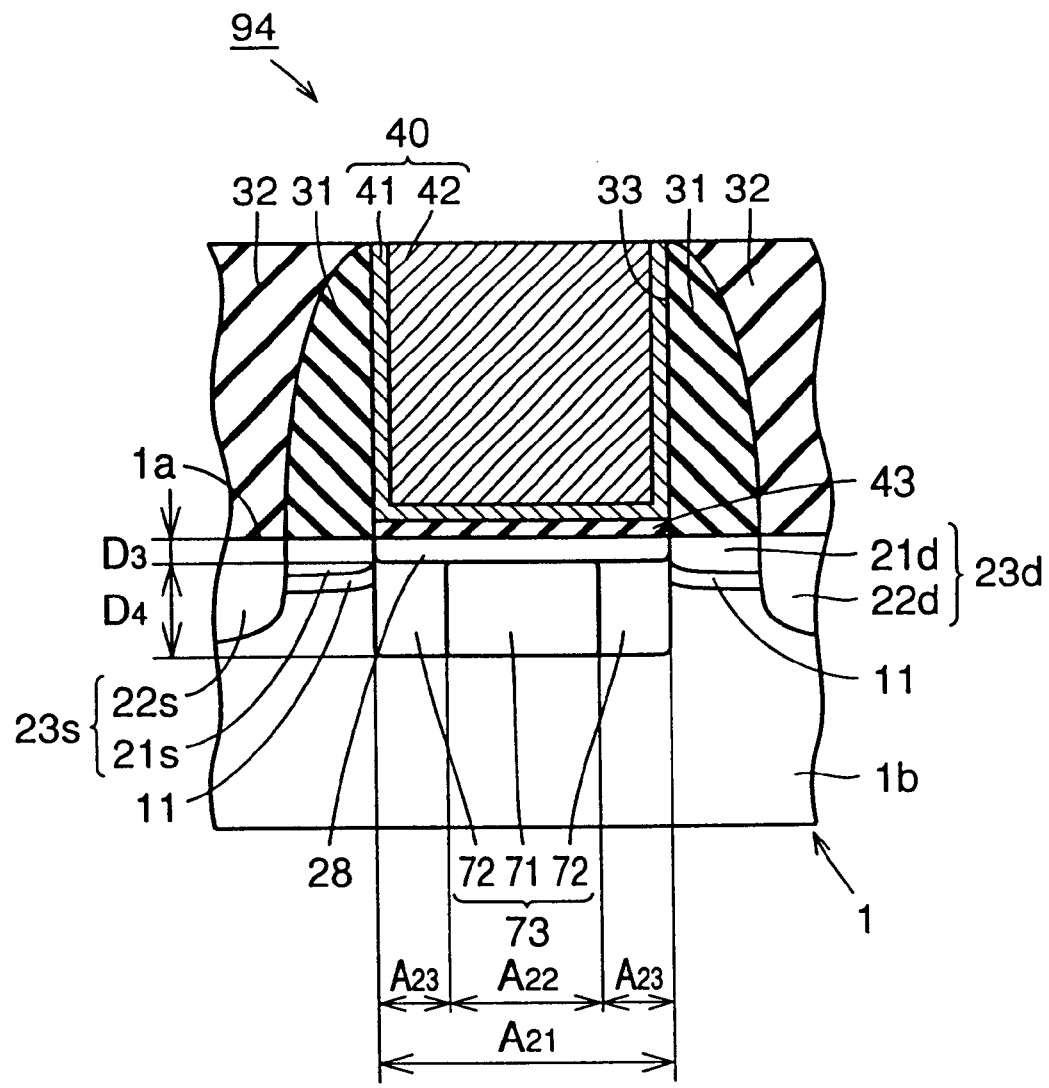
FIG. 10 is a cross section of a semiconductor device according to a third embodiment of the invention.

Referring to FIG. 10, a semiconductor device according to a third embodiment of the invention includes semiconductor substrate 1 having p-type semiconductor region 1b, and a field-effect transistor 94 formed in semiconductor region 1b. Field-effect transistor 94 includes gate electrode 40, source and drain regions 23s and 23d serving as a pair of first impurity regions, and a channel dope region 73 serving as a second impurity region. Gate electrode 40 is formed on semiconductor region 1b with gate insulating film 43 therebetween. Channel dope region 73 includes lightly doped impurity regions 72 which have a relatively low concentration of p-type impurity, and are relatively close to paired source and drain regions 23s and 23d, respectively, and a heavily doped impurity region 71 which has a relatively high concentration of p-type impurity, and is relatively remote from paired source and drain regions 23s and 23d. Channel region 28 is formed between channel dope region 73 and gate insulating film 43. Channel region 28 has a depth $D_3$ of 30 nm. Channel dope region 73 has a depth $D_4$ of 180 nm. Heavily doped impurity region 71 has a length $A_{22}$ of 50 nm. Lightly doped impurity region 72 has a length $A_{23}$ of 50 nm. Heavily doped impurity region 71 contains boron in a concentration of $6 \times 10^{17}/cm^3$. Lightly doped impurity region 72 contains boron in a concentration of $3 \times 10^{17}/cm^3$.

Figure 11:
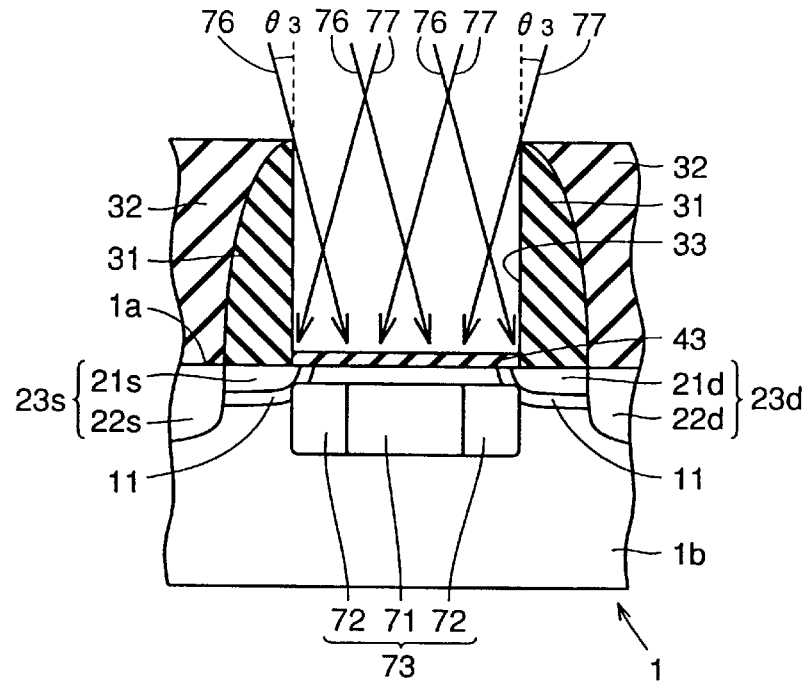
FIG. 11 is a cross section showing a step of manufacturing the semiconductor device shown in FIG. 10.

A method of manufacturing the semiconductor device shown in FIG. 10 will now be described. Referring to FIG. 11, processing is performed similarly to the first embodiment to form source and drain regions 23s and 23d, pocket regions 11, gate insulating film 43, side wall oxide film 31, interlayer insulating film 32 and aperture 33 at or on silicon substrate 1. Boron is implanted into semiconductor region 1b of silicon substrate 1 in a direction, which forms an angle $\theta_3$ (14°) with respect to the normal of main surface 1a of silicon substrate 1, and is directed from source region 23s toward drain region 23d, i.e., in the direction indicated by arrows 76 with conditions of an implantation energy of 10–50 keV and an implantation dose of $1 \times 10^{12}$–$6 \times 10^{13}/cm^2$. Then, boron is implanted into semiconductor region 1b in a direction, which forms an angle $\theta_3$ (14°) with respect to the normal of main surface 1a of silicon substrate 1, and is directed from drain region 23d toward source region 23s, i.e., in the direction indicated by arrows 77 with conditions of an implantation energy of 10–50 keV and an implantation dose of $1 \times 10^{12}$–$6 \times 10^{13}/cm^2$. Thereby, heavily doped impurity region 71 is formed by a portion, which was subjected twice to the implantation, i.e., to the implantation in the direction indicated by arrows 76 and the implantation in the direction indicated by arrows 77. Further, lightly doped impurity regions 72 are formed by portions, which are subjected only once to the implantation, i.e., the implantation in the direction indicated by arrows 76 or in the direction indicated by arrows 77.

Referring to FIG. 10, channel region 28 is formed similarly to the second embodiment. Then, processing is performed to form gate electrode 40 which fills aperture 33, and is formed of barrier layer 41 and metal layer 43. Thereby, field-effect transistor 94 shown in FIG. 10 is completed.

In the semiconductor device described above, channel dope region 73 is formed for preventing punch-through between source and drain regions 23s and 23d. This channel dope region 73 is formed of heavily doped impurity region 71 having a relatively high boron concentration and lightly doped impurity regions 72. Since lightly doped impurity region 72 having a relatively low boron concentration is formed in the vicinity of drain region 23d, a high electric field does not occur across lightly doped impurity region 72 and drain region 23d. Therefore, generation of hot carriers can be prevented in this portion, and the semiconductor device can have high reliability.

Further, heavily doped impurity region 71 having a high boron concentration is formed in the central portion of channel dope region 73. Therefore, punch-through between source region 23s and drain region 23d can be effectively prevented.

Implantation angle θ must satisfy a relationship of 8°$\leq$θ$\leq$$\tan^{-1}$ (L/2H). The conditions of 8°$\leq$θ is required for the following reason. If implantation angle θ were smaller than 8°, the heavily doped impurity region would be located closer to the impurity region of the second conductivity type, and it would be impossible to prevent generation of hot carriers. The conditions of θ$\leq$$\tan^{-1}$ (L/2H) is required for the following reason. If implantation angle θ were larger than $\tan^{-1}$ (L/2H), the heavily doped impurity region would not be formed in the central portion, and the effect of preventing the punch-through would decrease, resulting in reduction of reliability of the semiconductor device.

The size of the aperture and the implantation angle are not restricted to the values of the foregoing embodiment and implantation angle θ may be adjusted within a range of 8°$\leq$θ$\leq$$\tan^{-1}$ (L/2H). More specifically, aperture 33 may have length L of 160 nm and depth H of 200 nm, in which case angle θ is in a range of 8°$\leq$θ$\leq$22°. When angle θ is equal to 8°, lightly doped impurity region 72 has the length of 28 nm. If the length of lightly doped impurity region 72 were smaller than this value, concentrating of the electric field would occur, and generation of hot carriers would become remarkable.

Figure 12:
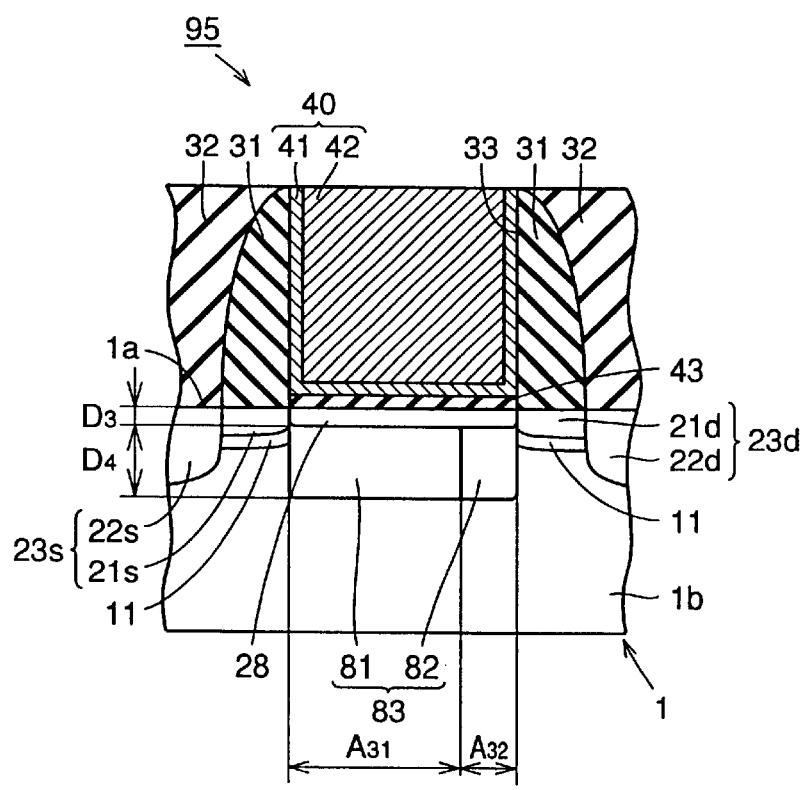
FIG. 12 is a cross section of a semiconductor device according to a fourth embodiment of the invention.

Referring to FIG. 12, a semiconductor device includes a semiconductor substrate 1 having p-type semiconductor region 1b and a field-effect transistor 95 formed in semiconductor region 1b. Field-effect transistor 95 includes a heavily doped impurity region 81, which has a relatively high boron concentration, and is located close to source region 23s. In these points, field-effect transistor 95 differs from field-effect transistor 94 shown in FIG. 10, in which heavily doped impurity region 71 having a relatively high boron concentration is not located near source region 23s. A channel dope region 83 includes heavily doped impurity region 81 having a relatively high boron concentration, and lightly doped impurity region 82 having a relatively low boron concentration. Heavily doped impurity region 81 has a length $A_{31}$ of 100 nm. Lightly doped impurity region 82 has a length $A_{32}$ of 40 nm. Heavily doped impurity region 81 has a boron concentration of $8\times10^{17}/cm^3$, and lightly doped impurity region 82 has a boron concentration of $2\times10^{16}/cm^3$.

Figure 13:
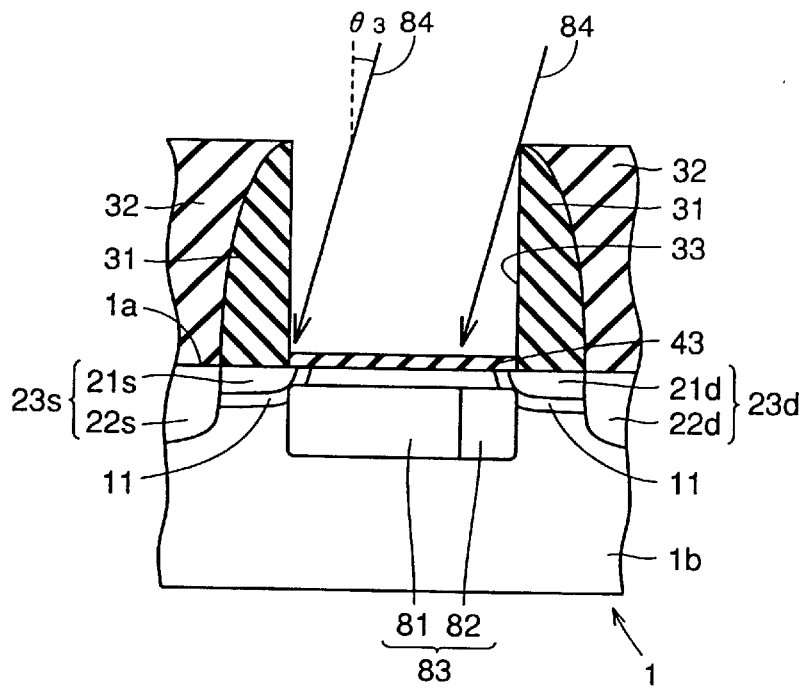
FIG. 13 is a cross section showing a step of manufacturing the semiconductor device shown in FIG. 12.
Figure 14:
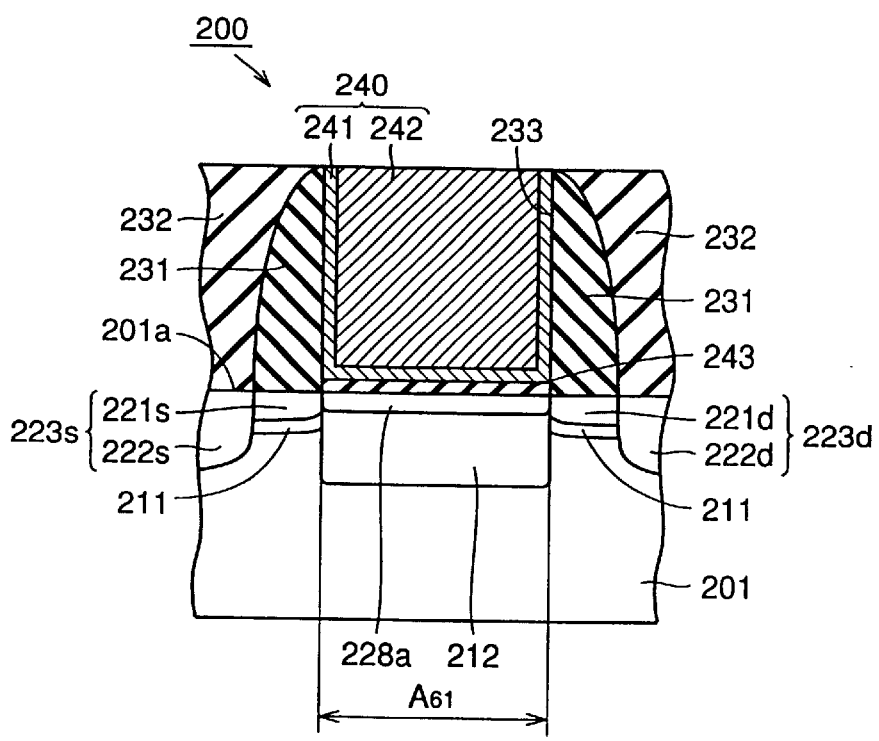
FIG. 14 is a cross section of a conventional semiconductor device using metal in a gate electrode.
Figure 15:
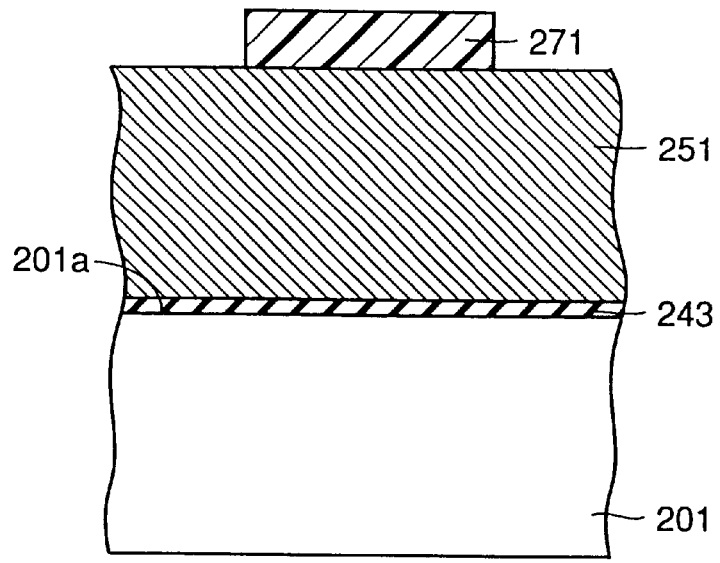
FIGS. 15 to 21 are cross sections showing first to seventh steps in a method of manufacturing the semiconductor device shown in FIG. 14, respectively.
Figure 16:
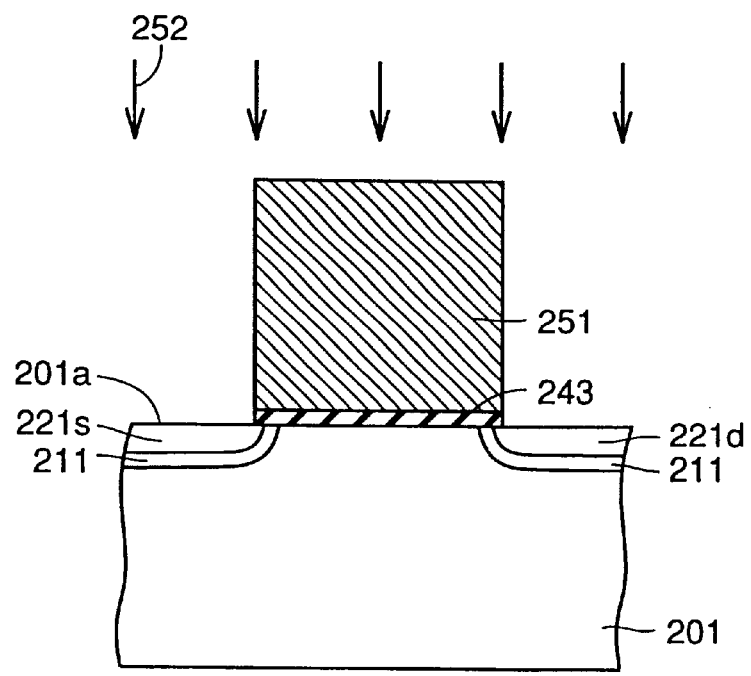
Figure 17:
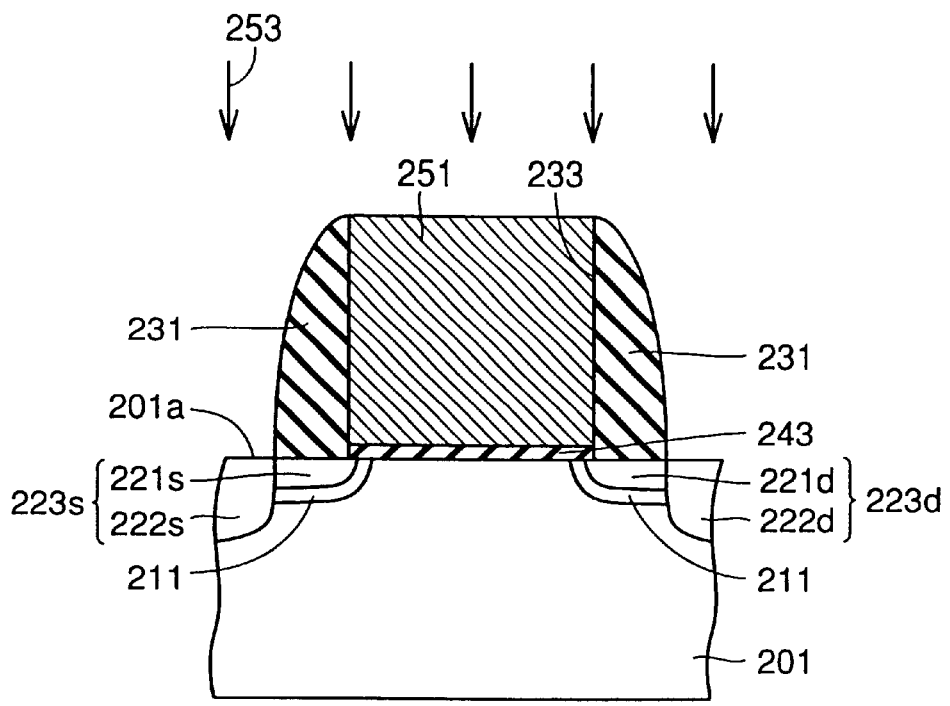
Figure 18:
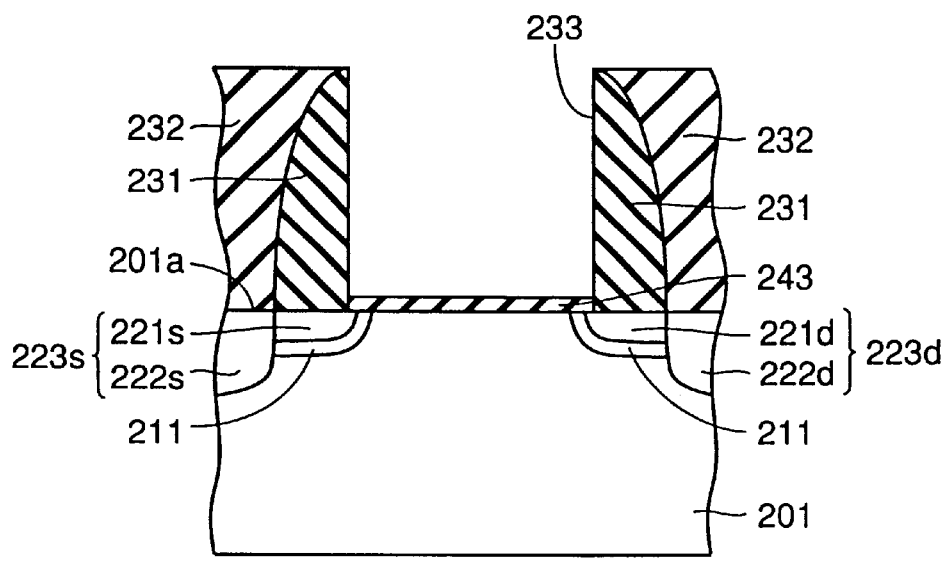
Figure 19:
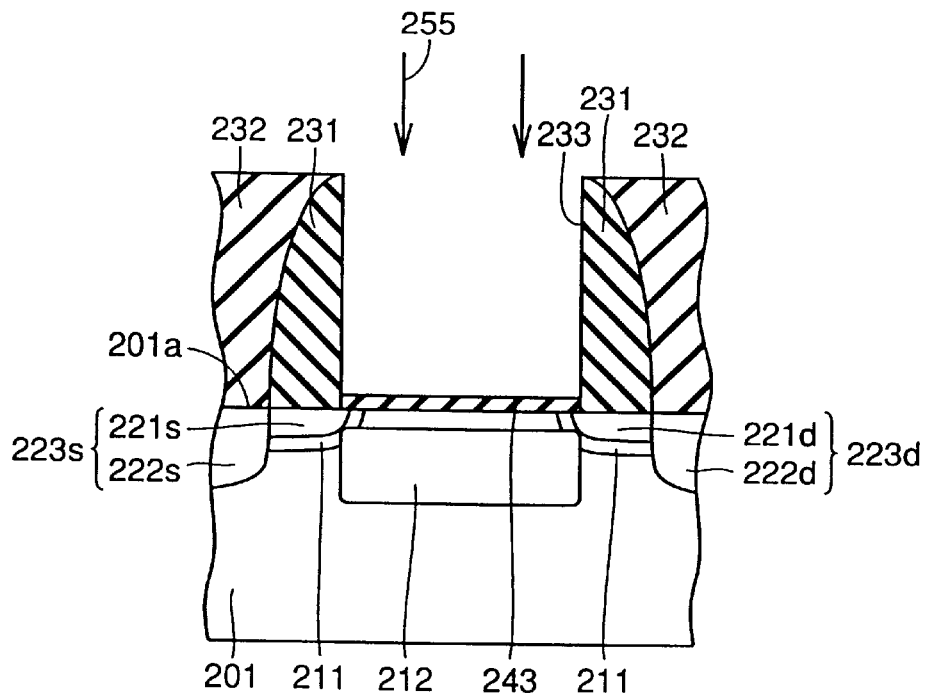
Figure 20:
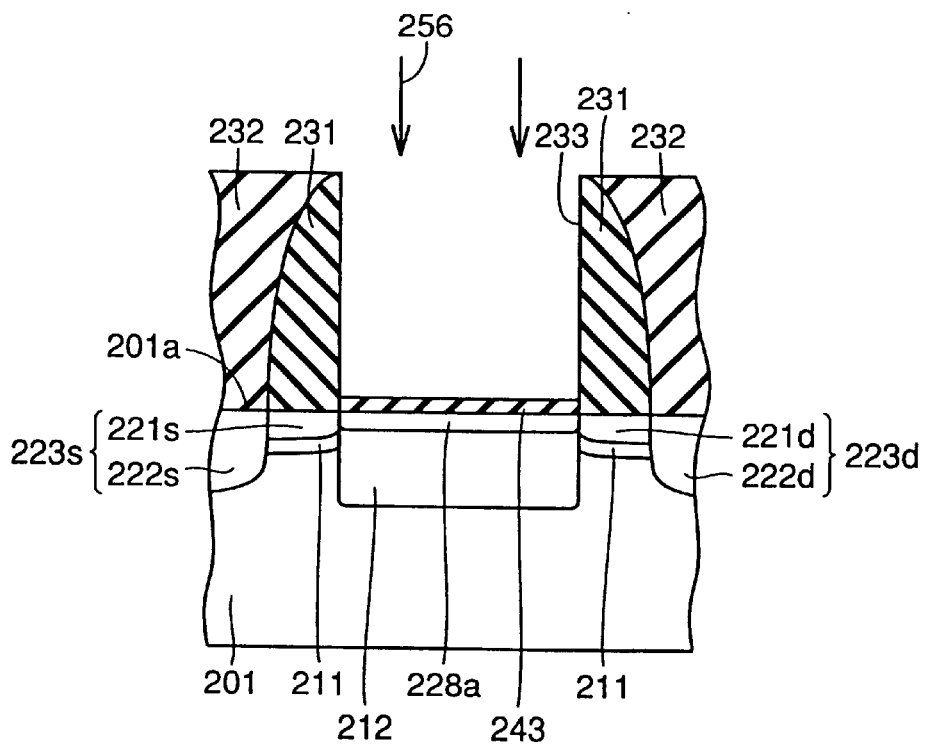
Figure 21:
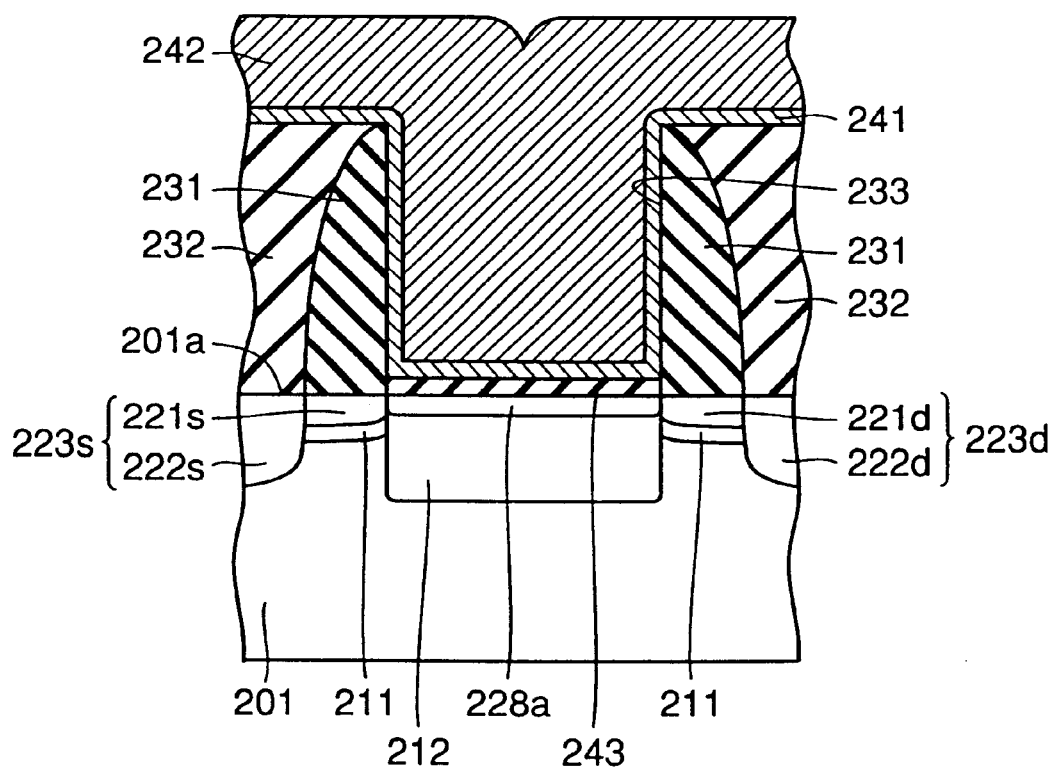
Figure 22:
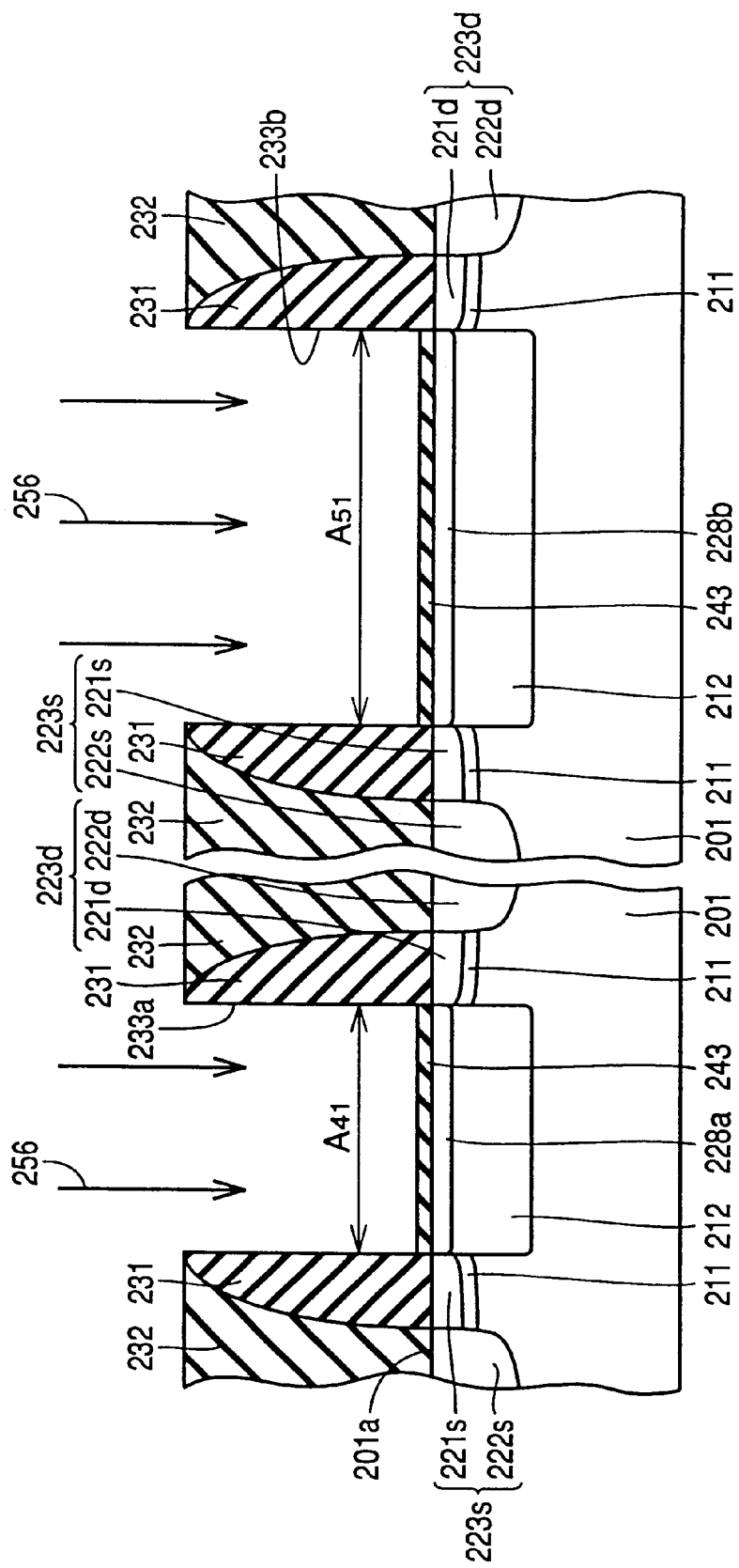
FIG. 22 is a cross section showing a problem arising in the semiconductor device shown in FIG. 14.

A method of manufacturing the semiconductor device shown in FIG. 12 will be now be described. FIG. 13 is a cross section showing the method of manufacturing the semiconductor device shown in FIG. 12. Referring to FIG. 13, processing is performed to form, at or on silicon substrate 1, source region 23s, drain region 23d, pocket regions 11, gate insulating film 43, side wall oxide film 31 and interlayer insulating film 32, similarly to the third embodiment. Boron is implanted into semiconductor region 1b in a direction, which forms an angle $\theta_3$ (14°) with respect to the normal of main surface 1a of silicon substrate 1, and is directed from drain region 23d toward source region 23s, i.e., in the direction indicated by arrows 84 with conditions of an implantation energy of 10–50 keV and an implantation dose of $1\times10^{12}$–$6\times10^{13}/cm^2$. Thereby, heavily doped impurity region 81 is formed by the portion into which boron was implanted. Lightly doped impurity region 82 is formed by the portion, which was not subjected to the implantation of boron but contains boron slightly diffused from heavily doped impurity region 81. Thereafter, channel region 28 and gate electrode 40 are formed similarly to the third embodiment so that the semiconductor device shown in FIG. 12 is completed.

Semiconductor device 12 thus constructed has effects similar to those of the semiconductor device of the third embodiment. Further, as shown in FIG. 11, the step of boron implantation is performed only once. Therefore, the semiconductor device can be manufactured through fewer steps than that of the third embodiment, in which boron implantation is performed twice. Although heavily doped impurity region 81 is located near source region 23s, this does not cause particular generation of hot carriers because the hot carriers are usually generated near the drain region.

Although the embodiments of the invention have been described, these embodiments can be modified in various manner. First, the gate electrode is not restricted to the metal gate in the foregoing embodiments, and may be formed of a conventional gate electrode made of, e.g., polycrystalline silicon. If the gate electrode is made of polycrystalline silicon, it is not necessary to provide the channel region serving as the counter dope region. Further, the source and drain regions, which are formed of the n-type impurity regions, may be formed of p-type impurity regions, respectively. In the latter case, $BF_2$ is implanted as the impurity for forming lightly doped impurity regions 21s and 21d, and an implantation energy of 5–15 keV and an implantation dose of $1\times10^{15}$–$2\times10^{15}/cm^2$ are employed. For forming heavily doped impurity region 22s, $BF_2$ is implanted with an implantation energy of 10–30 keV and an implantation dose of $2\times10^{15}$–$6\times10^{15}/cm^2$. For forming channel dope region 12, arsenic is implanted with an implantation energy of 50–200 keV and an implantation dose of $1\times10^{12}$–$3\times10^{13}/cm^2$. For forming pocket region 11, arsenic is implanted with an implantation energy of 50–120 keV and an implantation dose of $5\times10^{12}$–$5\times10^{13}/cm^2$. For forming source and drain regions 23s and 23d containing p-type impurity, n-type impurity such as arsenic is implanted into semiconductor region 1b of semiconductor substrate 1.

According to the invention, it is possible to provide a semiconductor device which allows setting of the threshold voltage to an appropriate value, and has high reliability.

According to the invention, it is possible to provide a semiconductor device which allows setting of the threshold voltages of the plurality of field-effect transistors to a uniform value, and has high reliability.

According to the invention, it is possible to provide a semiconductor device which can prevent generation of hot carriers, and can prevent reduction in punch-through resistance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate having a semiconductor region of a first conductivity type; and a first field-effect transistor formed in said semiconductor region;

said first field-effect transistor including:

a first gate electrode formed on said semiconductor region with a gate insulating film therebetween;

a pair of source and drain regions formed in said semiconductor region and on the opposite sides of said first gate electrode, respectively, and containing impurity of a second conductivity type in a first, concentration, and a first channel region formed in said semiconductor region and under said first gate electrode, being in contact with said first source and drain regions, and containing impurity of the second conductivity type in a second concentration lower than said first concentration; and said first channel region including:

a pair of first lightly doped impurity regions being in contact with said first source and drain regions, respectively, and having a relatively low concentration of impurity of the second conductivity type, and a first heavily doped impurity region located between said paired first lightly doped impurity regions, and having a relatively high concentration of impurity of the second conductivity type.

2. The semiconductor device according to claim 1, further comprising:

a second field-effect transistor formed in said semiconductor region;

said second field-effect transistor including:

a second gate electrode formed on said semiconductor region with a gate insulating film therebetween, a pair of second source and drain regions formed in said semiconductor region and on the opposite sides of said second gate electrode, respectively, and including impurity of the second conductivity type in a third concentration, and a second channel region formed in said semiconductor region and under said second gate electrode, being in contact with said second source and drain regions, and including impurity of the second conductivity type in a fourth concentration lower than said third concentration; and said second channel region including:

a pair of second lightly doped impurity regions being in contact with said second source and drain regions, respectively, and having a relatively low concentration of impurity of the second conductivity type, and a second heavily doped impurity region located between said paired second lightly doped impurity regions, and having a relatively high concentration of impurity of the second conductivity type.

3. The semiconductor device according to claim 2, wherein said first gate electrode has a relatively small length, said second gate electrode has a relatively large length, said first channel region has a length $A_1$, said first heavily doped impurity region has a length $A_2$, said second channel region has a length $A_3$ larger than the length $A_1$, said second heavily doped impurity region has a length $A_4$, and said lengths $A_1$, $A_2$, $A_3$ and $A_4$ satisfy a relationship of $A_4/A_3 < A_2 A_1$.

4. The semiconductor device according to claim 3, wherein said first and second lightly doped impurity regions have the substantially equal lengths.

5. A semiconductor device comprising:

a semiconductor substrate having a semiconductor region of a p-type; and a field-effect transistor formed in said semiconductor region;

said field-effect transistor including:

a gate electrode formed on said semiconductor region with a gate insulating film therebetween;

a pair of first impurity regions of an n-type formed in said semiconductor region and on the opposite sides of said gate electrode, respectively, a second impurity region of the p-type formed in said semiconductor region, and being in contact with at least one of said first impurity regions, and a nitrogen region formed in said semiconductor region and under said gate electrode, having a high nitrogen concentration in the vicinity of a boundary between said second impurity region and at least one of said first impurity regions, and having a relatively low nitrogen concentration on a central side of said gate electrode.

6. The semiconductor device according to claim 5, wherein one of said first impurity regions is a drain region.

7. A semiconductor device comprising:

a semiconductor substrate having a semiconductor region of a first conductivity type; and a field-effect transistor formed in said semiconductor region;

said field-effect transistor including:

a gate electrode formed on said semiconductor region with a gate insulating film therebetween, a pair of first impurity regions formed in said semiconductor region and on the opposite sides of said gate electrode, respectively, and including impurity of a second conductivity type, and a second impurity region formed between said paired first impurity regions, and containing impurity of the first conductivity type; and said second impurity region including:

a lightly doped impurity region having a relatively low concentration of impurity of the first conductivity type, and located relatively close to one of said paired first impurity regions, and a heavily doped impurity region having a relatively high concentration of impurity of the first conductivity type, and being relatively remote from one of said paired first impurity regions.

8. The semiconductor device according to claim 7, wherein one of said first impurity regions is a drain region.

* * * * *